(12) United States Patent
Yamanaka et al.

(10) Patent No.: US 9,495,894 B2
(45) Date of Patent: Nov. 15, 2016

(54) DISPLAY DEVICE, AND DATA PROCESSING METHOD IN DISPLAY DEVICE

(71) Applicant: Sharp Kabushiki Kaisha, Osaka-shi, Osaka (JP)

(72) Inventors: Shigetsugu Yamanaka, Osaka (JP); Shinji Nakagawa, Osaka (JP); Hiroyuki Furukawa, Osaka (JP); Yoshifumi Ohta, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/759,440

(22) PCT Filed: Dec. 25, 2013

(86) PCT No.: PCT/JP2013/084564
§ 371 (c)(1),
(2) Date: Jul. 7, 2015

(87) PCT Pub. No.: WO2014/112299
PCT Pub. Date: Jul. 24, 2014

(65) Prior Publication Data
US 2015/0356899 A1 Dec. 10, 2015

(30) Foreign Application Priority Data
Jan. 21, 2013 (JP) .................................. 2013-008059

(51) Int. Cl.
*H05B 33/08* (2006.01)
*H01L 27/07* (2006.01)
(Continued)

(52) U.S. Cl.
CPC .............. *G09G 3/14* (2013.01); *G09G 3/2011* (2013.01); *G09G 3/3225* (2013.01);
(Continued)

(58) Field of Classification Search
CPC ................................................... H04N 10/619
See application file for complete search history.

(56) References Cited

U.S. PATENT DOCUMENTS

2005/0237340 A1* 10/2005 Ueno ................... G09G 3/3648
345/600
2007/0229480 A1 10/2007 Ookawara
(Continued)

FOREIGN PATENT DOCUMENTS

JP 0622515 * 8/1994 .............. H04N 1/41
JP H06-225151 A 8/1994
(Continued)

OTHER PUBLICATIONS

International Search Report PCT/ISA/210 for International Application No. PCT/JP2013/084564 dated Mar. 31, 2014.
(Continued)

*Primary Examiner* — Lin Li
(74) *Attorney, Agent, or Firm* — Harness, Dickey & Pierce, P.L.C.

(57) ABSTRACT

An embodiment of the present invention is directed to reducing a memory capacity required for saving compensating data (data used for compensating variations and the like in characteristic of a drive transistor) compared to conventional examples, in a display device. An organic EL display device using an oxide TFT for a drive transistor is provided with: a low pass filter for extracting low frequency component data from pixel current data as data of a drive current of the drive transistor; a first computing portion for obtaining high frequency component data by obtaining a difference between the pixel current data and the low frequency component data; a down-sampling portion for extracting data from the low frequency component data at predetermined sampling intervals; and a high frequency signal compression processing portion for extracting only high amplitude data out of the high frequency component data.

17 Claims, 28 Drawing Sheets

(51) Int. Cl.
G09G 3/36 (2006.01)
G01D 4/00 (2006.01)
H04N 19/61 (2014.01)
H04N 5/20 (2006.01)
G09G 3/20 (2006.01)
H04N 7/26 (2006.01)
H04N 1/41 (2006.01)
G09G 3/14 (2006.01)
G09G 3/32 (2016.01)
H01L 51/50 (2006.01)

(52) U.S. Cl.
CPC ......... *G09G 3/3233* (2013.01); *G09G 3/3258* (2013.01); *G09G 3/3283* (2013.01); *G09G 2300/08* (2013.01); *G09G 2300/0842* (2013.01); *G09G 2320/0233* (2013.01); *G09G 2320/0271* (2013.01); *G09G 2320/045* (2013.01); *G09G 2320/046* (2013.01); *G09G 2320/0633* (2013.01); *H01L 51/50* (2013.01)

(56) References Cited

U.S. PATENT DOCUMENTS

| 2007/0273701 | A1 | 11/2007 | Mizukoshi et al. |
| 2010/0046845 | A1 | 2/2010 | Wedi et al. |
| 2011/0136451 | A1* | 6/2011 | Schrag ............ G01D 4/00 455/127.1 |
| 2013/0140617 | A1* | 6/2013 | Umezaki ......... H01L 27/0733 257/296 |
| 2013/0154498 | A1* | 6/2013 | Missbach ............ H05B 33/08 315/210 |

FOREIGN PATENT DOCUMENTS

| JP | H 10-254410 A | 9/1998 | | |
| JP | 2001-175221 A | 6/2001 | | |
| JP | 2002-354394 A | 12/2002 | | |
| JP | 2006-195313 A | 7/2006 | | |
| JP | 2006-284971 A | 10/2006 | | |
| JP | 2011019077 | * 1/2007 | ............ | H04N 7/26 |
| JP | 2007-271940 A | 10/2007 | | |
| JP | 2007-279290 A | 10/2007 | | |
| JP | 2007271940 | * 10/2007 | ............ | G09G 3/20 |
| JP | 2007-286295 A | 11/2007 | | |
| JP | WO 2008/066025 | * 6/2008 | .......... | H04N 19/619 |
| JP | 2011-019077 A | 1/2011 | | |
| JP | WO 2011/105377 | * 9/2011 | ............ | H04N 5/208 |
| JP | 2012-141626 A | 7/2012 | | |
| WO | WO-2008/066025 A1 | 6/2008 | | |

OTHER PUBLICATIONS

Written Opinion of the International Searching Authority PCT/ISA/237 for International Application No. PCT/JP2013/084564 dated Mar. 31, 2014.

\* cited by examiner

Fig.28

| VALUE | CODE | VALUE | CODE |
|---|---|---|---|
| +15 | 11101111 | −15 | 11111111 |
| +14 | 11101110 | −14 | 11111110 |
| +13 | 11101101 | −13 | 11111101 |
| +12 | 11101100 | −12 | 11111100 |
| +11 | 1110101 | −11 | 1111101 |
| +10 | 1110100 | −10 | 1111100 |
| +9 | 1110011 | −9 | 1111011 |
| +8 | 1110010 | −8 | 1111010 |
| +7 | 1110001 | −7 | 1111001 |
| +6 | 1110000 | −6 | 1111000 |
| +5 | 110011 | −5 | 110111 |
| +4 | 110010 | −4 | 110110 |
| +3 | 110001 | −3 | 110101 |
| +2 | 110000 | −2 | 110100 |
| +1 | 100 | −1 | 101 |
| 0 | 0 | | |

US 9,495,894 B2

DISPLAY DEVICE, AND DATA PROCESSING METHOD IN DISPLAY DEVICE

TECHNICAL FIELD

The present invention relates to a display device, and more specifically relates to a display device using an electric optical element such as an organic light emitting diode (OLED) as a display element, and a data processing method in the display device.

BACKGROUND ART

As a display element provided in a display device, there have conventionally been an electric optical element in which a luminance is controlled by an applied voltage and an electric optical element in which a luminance is controlled by a flowing current. Typical examples of the electric optical element in which a luminance is controlled by an applied voltage include a liquid crystal display element. Typical examples of the electric optical element in which a luminance is controlled by a flowing current include an OLED. The OLED is also called an organic electro luminescence (EL) element. An organic EL display device that uses the OLED being a spontaneous light-emitting electric optical element can be easily reduced in thickness and power consumption and increased in luminance as compared to the liquid crystal display device that requires a backlight, a color filter, and the like. Hence, in recent years, development of the organic EL display device has been actively advanced.

There are two kinds of driving techniques for the organic EL display device, namely, a passive matrix technique (also referred to as simple matrix technique) and an active matrix technique. As for an organic EL display device employing the passive matrix technique (hereinafter referred to as "passive matrix type organic EL display device"), its structure is simple, but a large size and high definition are difficult to achieve. In contrast, as for an organic EL display device employing the active matrix technique (hereinafter referred to as "active matrix type organic EL display device"), a large size and high definition can be easily realized as compared to the passive matrix type organic EL display device.

The active matrix type organic EL display device includes a plurality of pixel circuits arranged in a matrix form. Further, the pixel circuit of the active matrix type organic EL display device typically includes an input transistor for selecting a pixel and a drive transistor for controlling supply of a current to the OLED. Hereinafter, a current that flows from the drive transistor to the OLED is referred to as a "drive current".

As for the drive transistor, a thin film transistor (TFT) has typically been used. However, regarding the drive transistor, variations in characteristic tend to occur. The variations in characteristic of the drive transistor become a factor of variations in luminance. For example, even when the same gradation signal (gradation voltage) is given to all pixels, a different luminance appears with respect to each of the pixels. It should be noted that the "characteristic of the drive transistor" referred herein is, for example, a threshold voltage, mobility, or the like of the drive transistor.

It is known that degradation of the OLED proceeds as the light emission time becomes longer, resulting in deterioration in light emission luminance from an initial state. That is, when degradation of the OLED proceeds, a desired light emission luminance is not acquired even when the same drive current as in the initial state is allowed to flow. Hereinafter, the degradation of the OLED which proceeds as the light emission time thereof becomes longer is referred to as "time degradation". Further, for example when the time degradation of the OLED proceeds more at a certain pixel than at peripheral pixels, a luminance difference between those pixels is visually recognized. Such a phenomenon is called "burning".

It should be noted that the following related art documents are known in connection with the present invention. Japanese Patent Application Laid-Open No. 2001-175221, Japanese Patent Application Laid-Open No. 2007-286295 and Japanese Patent Application Laid-Open No. 2006-284971 each discloses a technique for suppressing occurrence of burning in a display device. Specifically, in a display device described in Japanese Patent Application Laid-Open No. 2001-175221, processing of lowering light emission luminance of pixels to the same level as a light emission luminance of a pixel where burning has occurred (processing of adjusting light emission luminance of other pixels in accordance with a light emission luminance of a degraded pixel) is performed, to make burning inconspicuous. In a display device of Japanese Patent Application Laid-Open No. 2007-286295, a high luminance display screen (all-white screen) is displayed every time a predetermined user's event is detected, to suppress occurrence of a difference in light emission luminance within the display screen. Japanese Patent Application Laid-Open No. 2006-284971 discloses a burning correction apparatus provided with: a correction amount deciding portion for deciding a correction amount corresponding to each pixel based on a degradation amount of each pixel; a variation determining portion for calculating information indicating a degree of variations in correction amount distribution; and a gradation converting portion for converting an input gradation value to an output gradation value with reference to a gamma curve formed so as to compress a gradation difference more effectively as the variations in correction amount distribution is larger.

Further, Japanese Patent Application Laid-Open No. 2006-195313 discloses a technique of reducing a memory capacity required for saving burning information. Japanese Patent Application Laid-Open No. 2012-141626 discloses a technique of suppressing occurrence of luminance unevenness in a display device. Japanese Patent Application Laid-Open No. 2007-279290 discloses a technique of reducing a memory capacity required for saving correction data for suppressing variations in luminance.

PRIOR ART DOCUMENTS

Patent Documents

[Patent Document 1] Japanese Patent Application Laid-Open No. 2001-175221
[Patent Document 2] Japanese Patent Application Laid-Open No. 2007-286295
[Patent Document 3] Japanese Patent Application Laid-Open No. 2006-284971
[Patent Document 4] Japanese Patent Application Laid-Open No. 2006-195313
[Patent Document 5] Japanese Patent Application Laid-Open No. 2012-141626
[Patent Document 6] Japanese Patent Application Laid-Open No. 2007-279290

SUMMARY OF THE INVENTION

Problems to be Solved by the Invention

In order to suppress "occurrence of burning and variations in luminance" caused by "variations in characteristic of the drive transistor or time degradation of the OLED", it has been proposed to correct a gradation signal by use of data in accordance with a change in characteristic (of the drive transistor or the OLED). Specifically, it has been proposed to correct a gradation signal at each pixel based on data obtained by measuring a current at each pixel (measurement data). It should be noted that, since the measurement data is used for compensating variations in characteristic of the drive transistor or time degradation of the OLED, hereinafter, such measurement data will be referred to as "compensating data". However, an amount of the compensating data increases as a size of the panel increases and resolution thereof is enhanced, leading to an increase in memory capacity required for saving the compensating data. The increase in memory capacity becomes a factor of a cost increase.

Accordingly, an object of the present invention is to provide a display device configured to reduce a memory capacity required for saving compensating data (data used for compensating variations in characteristic of a drive transistor and the like) compared to the conventional display device.

Means for Solving the Problems

A first aspect of the present invention is directed to a display device including a plurality of pixel circuits each having an electric optical element in which a luminance is controlled by a current, and a drive transistor configured to control a current to be supplied to the electric optical element, the drive transistor having a channel layer formed of an oxide semiconductor, the display device comprising:
 a current measuring portion configured to measure a drive current of the drive transistor included in each of the pixel circuits and to output a value of the drive current as current data;
 a current data dividing portion configured to divide the current data into high frequency component data and low frequency component data;
 a high frequency component data compression processing portion configured to compress the high frequency component data;
 a low frequency component data compression processing portion configured to compress the low frequency component data; and
 a storage portion configured to save the high frequency component data after compression by the high frequency component data compression processing portion and the low frequency component data after compression by the low frequency component data compression processing portion,
 wherein data compression is performed by different techniques in the high frequency component data compression processing portion and the low frequency component data compression processing portion.

According to a second aspect of the present invention, in the first aspect of the present invention,
 the current data dividing portion has
 a high frequency component removing filter configured to allow the low frequency component data out of the current data to pass and remove the high frequency component data out of the current data, and
 a low frequency component removing filter configured to allow the high frequency component data out of the current data to pass and remove the low frequency component data out of the current data.

According to a third aspect of the present invention, in the first aspect of the present invention, the current data dividing portion has
 a high frequency component removing filter configured to allow the low frequency component data out of the current data to pass and remove the high frequency component data out of the current data, and
 a high frequency component computing portion configured to obtain the high frequency component data based on a difference between the low frequency component data having passed through the high frequency component removing filter and the current data.

According to a fourth aspect of the present invention, in the first aspect of the present invention,
 the current data dividing portion has
 a low frequency component removing filter configured to allow the high frequency component data out of the current data to pass and remove the low frequency component data out of the current data, and
 a low frequency component computing portion configured to obtain the low frequency component data based on a difference between the high frequency component data having passed through the low frequency component removing filter and the current data.

According to a fifth aspect of the present invention, in the first aspect of the present invention,
 the low frequency component data compression processing portion extracts data to be saved into the storage portion from a data group constituting the low frequency component data with respect to each predetermined number of pixel circuits.

According to a sixth aspect of the present invention, in the fifth aspect of the present invention,
 the low frequency component data compression processing portion calculates an extraction interval at the time of extracting data to be saved into the storage portion from a data group constituting the low frequency component data so as to obtain a target compression ratio which is determined in consideration of a capacity of the storage portion.

According to a seventh aspect of the present invention, in the first aspect of the present invention,
 the high frequency component data compression processing portion divides the high frequency component data into low amplitude data having an amplitude not larger than a predetermined width and high amplitude data having an amplitude larger than the predetermined width, and saves only the high amplitude data out of the low amplitude data and the high amplitude data into the storage portion.

According to an eighth aspect of the present invention, in the seventh aspect of the present invention,
 the high frequency component data compression processing portion redefines the high amplitude data based on an upper limit and a lower limit of the amplitude with the predetermined width, and saves the redefined high amplitude data into the storage portion.

According to a ninth aspect of the present invention, in the eighth aspect of the present invention,
 the high frequency component data compression processing portion performs data compression with respect to each high frequency component data corresponding to the pixel circuits for one row, and
 the upper limit and the lower limit of the amplitude that serve as references at the time of redefining of the high amplitude data are obtained based on data amount after compression with respect to a row where the data compression has already been performed and a capacity of the storage portion when the high frequency component data corresponding to the pixel circuits on each row are compressed.

According to a tenth aspect of the present invention, in the first aspect of the present invention, the high frequency component data compression processing portion divides the high frequency component data into low amplitude data having an amplitude not larger than a predetermined width and high amplitude data having an amplitude larger than the predetermined width, performs relatively rough quantization on the low amplitude data, performs relatively fine quantization on the high amplitude data, and saves the data obtained by the quantization into the storage portion.

According to an eleventh aspect of the present invention, in the first aspect of the present invention, the high frequency component data compression processing portion performs re-quantization on the high frequency component data and performs Huffman coding on the data obtained by the re-quantization, to compress the high frequency component data.

According to a twelfth aspect of the present invention, in the eleventh aspect of the present invention, the high frequency component data compression processing portion performs re-quantization and Huffman coding with respect to each high frequency component data corresponding to pixel circuits for one row, processing of multiplying a value of high frequency component data as an object of re-quantization by a parameter value is performed before the re-quantization is performed, and when the re-quantization is performed on the high frequency component data corresponding to the pixel circuits for each row, the parameter value is obtained based on data amount after Huffman-coding with respect to a row where the re-quantization and the Huffman coding have already been performed and a capacity of the storage portion.

According to a thirteenth aspect of the present invention, in the first aspect of the present invention, at least one of the high frequency component data compression processing portion and the low frequency component data compression processing portion compresses data by performing the re-quantization.

According to a fourteenth aspect of the present invention, in the first aspect of the present invention, the display device further comprises a gradation value correcting portion configured to receive a gradation signal that indicates a gradation value corresponding to each of the pixel circuits and to generate a driving gradation signal to be used for driving the drive transistor by correcting the gradation value of the gradation signal, wherein the current measuring portion measures drive currents corresponding to at least two gradation values in each of the pixel circuits, and the gradation value correcting portion has a first characteristic calculating portion configured to obtain a measured current voltage characteristic which is a current voltage characteristic at the time point of measurement of drive currents in each of the pixel circuits based on current data outputted from the current measuring portion, the current data corresponding to the at least two gradation values in each of the pixel circuits, a second characteristic calculating portion configured to obtain a target current voltage characteristic which is a current voltage characteristic as a target in each of the pixel circuits based on current data corresponding to the at least two gradation values with respect to a plurality of pixel circuits including the pixel circuit, and a driving gradation value calculating portion configured to obtain a gradation value of the driving gradation signal such that a current value which is obtained from the target current voltage characteristic and corresponds to the gradation value of the gradation signal is equal to a current value which is obtained from the measured current voltage characteristic and corresponds to the gradation value of the driving gradation signal.

According to a fifteenth aspect of the present invention, in the fourteenth aspect of the present invention, the first characteristic calculating portion converts a function representing the measured current voltage characteristic from a non-linear function to a linear function, and the second characteristic calculating portion converts a function representing the target current voltage characteristic from a non-linear function to a linear function.

According to a sixteenth aspect of the present invention, in the first aspect of the present invention, the oxide semiconductor is indium gallium zinc oxide mainly composed of indium (In), gallium (Ga), zinc (Zn), and oxygen (O).

A seventeenth aspect of the present invention is directed to a data processing method in a display device including a plurality of pixel circuits each having an electric optical element in which a luminance is controlled by a current, and a drive transistor configured to control a current to be supplied to the electric optical element, the drive transistor having a channel layer formed of an oxide semiconductor, the data processing method comprising:

current measuring step of measuring a drive current of the drive transistor included in each of the pixel circuits to output a value of the drive current as current data;

a current data dividing step of dividing the current data into high frequency component data and low frequency component data;

a high frequency component data compression processing step of compressing the high frequency component data;

a low frequency component data compression processing step of compressing the low frequency component data; and a saving step of saving, into a predetermined storage portion, the high frequency component data after compression by the high frequency component data compression processing step and the low frequency component data after compression by the low frequency component data compression processing step, wherein data compression is performed by different techniques in the high frequency component data compression processing step and the low frequency component data compression processing step.

Effects of the Invention

According to the first aspect of the present invention, in the display device (typically an organic EL display device) employing the electric optical element in which a luminance is controlled by a current as the display element, the following processing is performed on the current data as the compensating data, which is acquired for suppressing "occurrence of burning and variations in luminance" caused by "variations in characteristic of the drive transistor or time degradation of the electric optical element". First, the current data is divided into the high frequency component data and the low frequency component data. The high frequency component data and the low frequency component data are then compressed by respectively different techniques. Here, for the drive transistor, a transistor with a channel layer formed of an oxide semiconductor (oxide transistor) is employed. According to the present invention, taken into consideration of small variations in characteristic of the oxide transistor, it is possible to reduce an amount of the high frequency component data and an amount of the low frequency component data. With this configuration, it is possible to perform compression processing in consideration of the characteristic of the oxide semiconductor at the time of saving the current data as the compensating data into the storage portion. This allows effective reduction in the amount of the current data to be saved, without causing display failure at the time of displaying an image based on data after decoding. Hence, it is possible to effectively reduce the capacity of the storage portion (memory) for storing the compensating data (current data) in the display device such as the organic EL display device using the oxide transistor According to the second aspect of the present invention, in the configuration where the high frequency component removing filter and the low frequency component removing filter are provided, a similar effect to that of the first aspect of the present invention is obtained.

According to the third aspect of the present invention, in the configuration where the high frequency component removing filter is provided, a similar effect to that of the first aspect of the present invention is obtained.

According to the fourth aspect of the present invention, in the configuration where the low frequency component removing filter is provided, a similar effect to that of the first aspect of the present invention is obtained.

According to the fifth aspect of the present invention, as for the low frequency component data, data extraction by sampling is performed. Accordingly, a sampling interval is appropriately set while the amount of the low frequency component data and the capacity of the storage portion are considered, whereby it is possible to more effectively reduce the capacity of the storage portion for storing the compensating data.

According to the sixth aspect of the present invention, the sampling interval is decided in consideration of the capacity of the storage portion. Accordingly, even when the variations in luminance on the panel change with passage of time, it is possible to reliably save the compressed data into the storage portion.

According to the seventh aspect of the present invention, the low amplitude data out of the high frequency component data is not an object to be saved into the storage portion. This leads to effective reduction in the amount of the compensating data to be saved into the storage portion. Hence, it is possible to more effectively reduce the capacity of the storage portion for storing the compensating data.

According to the eighth aspect of the present invention, the high amplitude data out of the high frequency component data is saved into the storage portion after it is redefined so as to be reduced in the amount of data. Hence, it is possible to more effectively reduce the capacity of the storage portion for storing the compensating data.

According to the ninth aspect of the present invention, an amplitude value of a boundary between the high amplitude data and the low amplitude data is decided in consideration of the capacity of the storage portion. Accordingly, even when the variations in luminance on the panel change with passage of time, it is possible to reliably save the compressed data into the storage portion.

According to the tenth aspect of the present invention, since the amount of the high frequency component data is reduced in consideration of the characteristic of the oxide transistor, it is possible to effectively reduce the amount of the compensating data to be saved into the storage portion. Hence, it is possible to more effectively reduce the capacity of the storage portion for storing the compensating data.

According to the eleventh aspect of the present invention, the amount of the high frequency component data to be saved into the storage portion is effectively reduced.

According to the twelfth aspect of the present invention, the parameter value at the time of the high frequency component data being compressed is decided in consideration of the capacity of the storage portion. Accordingly, even when the variations in luminance on the panel change with passage of time, it is possible to reliably save the compressed data into the storage portion.

According to the thirteenth aspect of the present invention, at least one of the amount of the high frequency component data to be saved into the storage portion and the amount of the high frequency component data to be saved into the storage portion is effectively reduced.

According to the fourteenth aspect of the present invention, the gradation value is corrected based on the current voltage characteristic of each of the pixel circuits. Accordingly, occurrence of burning and variations in luminance caused by variations in characteristic of the drive transistor or time degradation of the electric optical element is suppressed while the effect of the first aspect of the present invention is achieved.

According to the fifteenth aspect of the present invention, the linear function is used as the function representing the current voltage characteristic at the time of processing of correcting the gradation value. This facilitates realization of the circuit for correcting the gradation value.

According to the sixteenth aspect of the present invention, it is possible to reliably achieve the effect of the first aspect of the present invention by use of indium gallium zinc oxide as the oxide semiconductor that forms the channel layer of the transistor. Further, it is possible to achieve high definition and low power consumption compared to the conventional arts.

According to the seventeenth aspect of the present invention, a similar effect to that of the first aspect of the present invention can be exerted in the data processing method in the display device.

BRIEF DESCRIPTION OF THE DRAWINGS

FIG. 28 is a diagram for describing one example of a Huffman coding table in the third embodiment of the present invention.

MODE FOR CARRYING OUT THE INVENTION

<0. Introduction>

Figure 1:
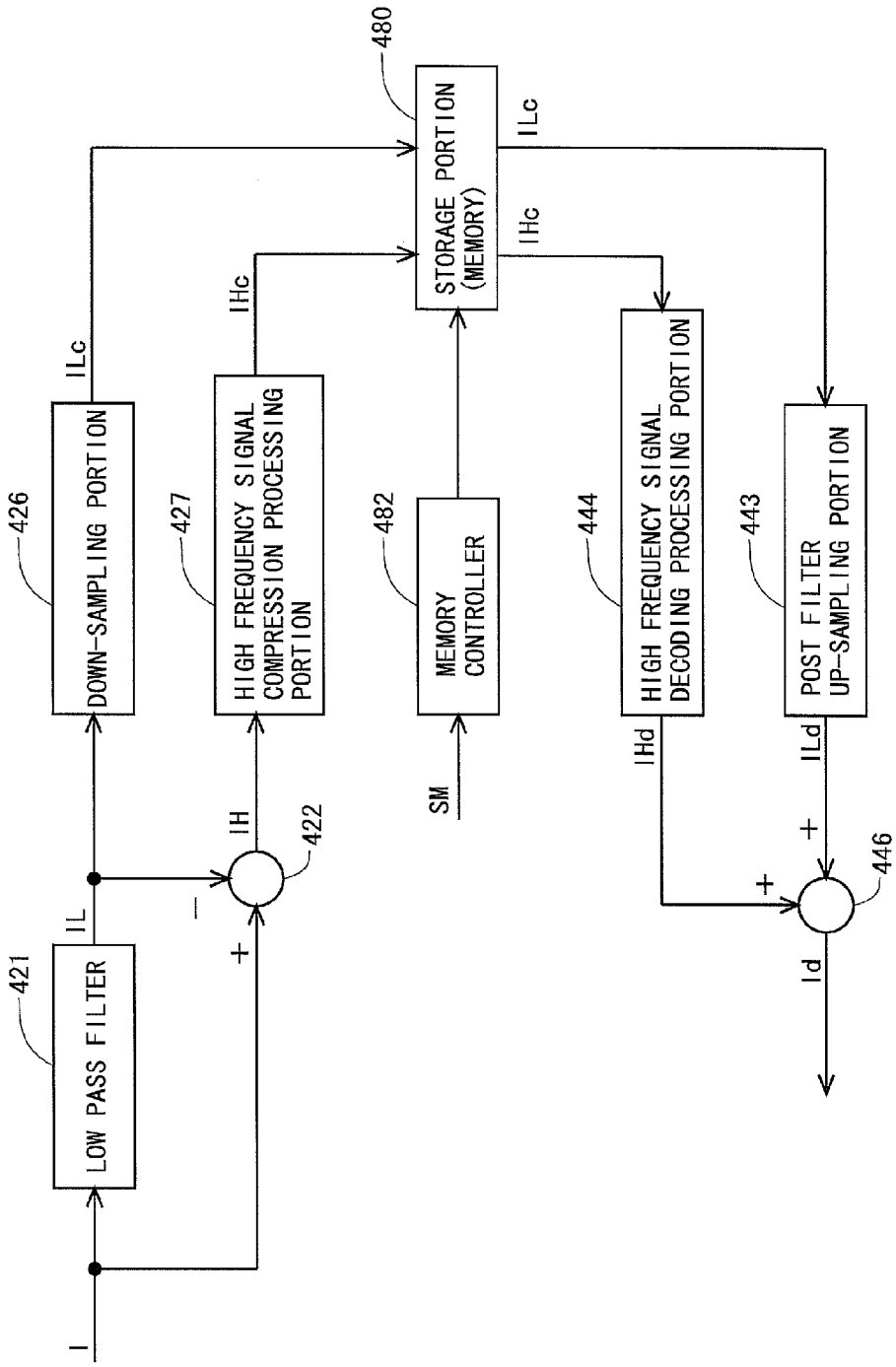
FIG. 1 is a block diagram for describing compression and decoding of pixel current data in an active matrix type organic EL display device according to a first embodiment of the present invention.

A general matter and the like concerning data compression will be described before descriptions of embodiments of the present invention. A variety of data compression techniques have conventionally been proposed in accordance with purposes and uses. In the case of saving compressed data (data obtained by performing compression processing on original data) into a memory installed in a display device, there has to be employed such a compression method as to make an amount of the compressed data not larger than a predetermined capacity. The reason for this is to prevent data damage attributed to the compressed data not being stored into the memory and prevent an increase in cost attributed to a margin being created in a memory capacity for avoiding such data damage.

In some compression techniques, when input data to be compressed is given, a data capacity after compression is almost uniquely decided. Typical examples of such compression techniques include compression by Huffman coding. According to compression by Huffman coding, an amount of information of input data is an amount of the compressed data. Therefore, when input data having an amount of information beyond a predetermined capacity is given, compressed data is not normally stored into the memory, to cause data damage.

Examples of the technique for making the amount of the compressed data not larger than the predetermined capacity include irreversible compression. Irreversible compression is employed when there is permitted data degradation (an error due to compression) to a certain degree in order to make the amount of the compressed data not larger than the predetermined capacity. Irreversible compression is used for compression of a moving image, for example.

The amount of the compressed data is controlled by adjusting a compression parameter for use in the compression processing. For example, by using that "a compression ratio is high when the compression parameter is set to a small value and the compression ratio is low when the compression parameter is set to a large value", the amount of the compressed data is suppressed to be not larger than a target value. The technique is called an "average bit rate (ABR) technique" in which while a capacity per unit (bit rate) changes, a certain constant compression ratio is set on average to make the amount of the compressed data not larger than the predetermined capacity. It should be noted that, in the present specification, "(data capacity after compression/data capacity before compression) ×100" refers to a "compression ratio". Further, "the compression ratio is high" means a numeral value of the compression ratio is small, and "the compression ratio is low" means a numeral value of the compression ratio is large.

The compression parameter controlling techniques include a single pass technique and a multi-pass technique. The single pass technique is a technique of varying the compression parameter while performing compression. In the single pass technique, at certain timing in the middle of the compression processing, how the compression parameter is varied during progression of the compression processing is decided based on the relation between an amount of the remaining data to be compressed and a free space of the memory for saving compressed data. That is, when it is determined that the memory capacity will be insufficient in the case of holding the current compression ratio, the compression parameter to be used in subsequent compression is adjusted so as to increase the compression ratio. In contrast, when it is determined that the memory capacity will be redundant in the case of holding the current compression ratio, the compression parameter to be used in subsequent compression is adjusted so as to decrease the compression ratio.

The multi-pass technique is a technique of dividing stages into a stage for deciding the compression parameter and a stage for actually performing compression. In the multi-pass technique, there is first performed compression by use of a temporarily set compression parameter. Then, the compression parameter is adjusted so as to increase the compression ratio when the compression ratio of the compressed data is lower than a desired compression ratio, and the compression parameter is adjusted so as to decrease the compression ratio when the compression ratio of the compressed data is higher than the desired compression ratio. Subsequently, the data is compressed by use of the updated compression parameter, thereby to realize the desired compression ratio. Note that the larger the number of repeats of the stage for deciding the compression ratio, the closer compression to the desired compression ratio is performed. The multi-pass technique is referred to as a "2-pass technique", a "3-pass technique", or the like in accordance with the number of repeats.

According to the single pass technique, its implementation is easy, but bringing the compression ratio close to the desired compression ratio is relatively difficult. According to the multi-pass technique, obtaining the desired compression ratio is relatively easy, but its implementation is difficult. It should be noted that, in the following, a description will be given by taking the single pass technique as an example in order to simplify the description. However, the present invention is not restricted to the single pass technique.

Hereinafter, embodiments of the present invention will be described with reference to attached drawings.

<1. First Embodiment>
<1.1 Whole Configuration>

Figure 2:
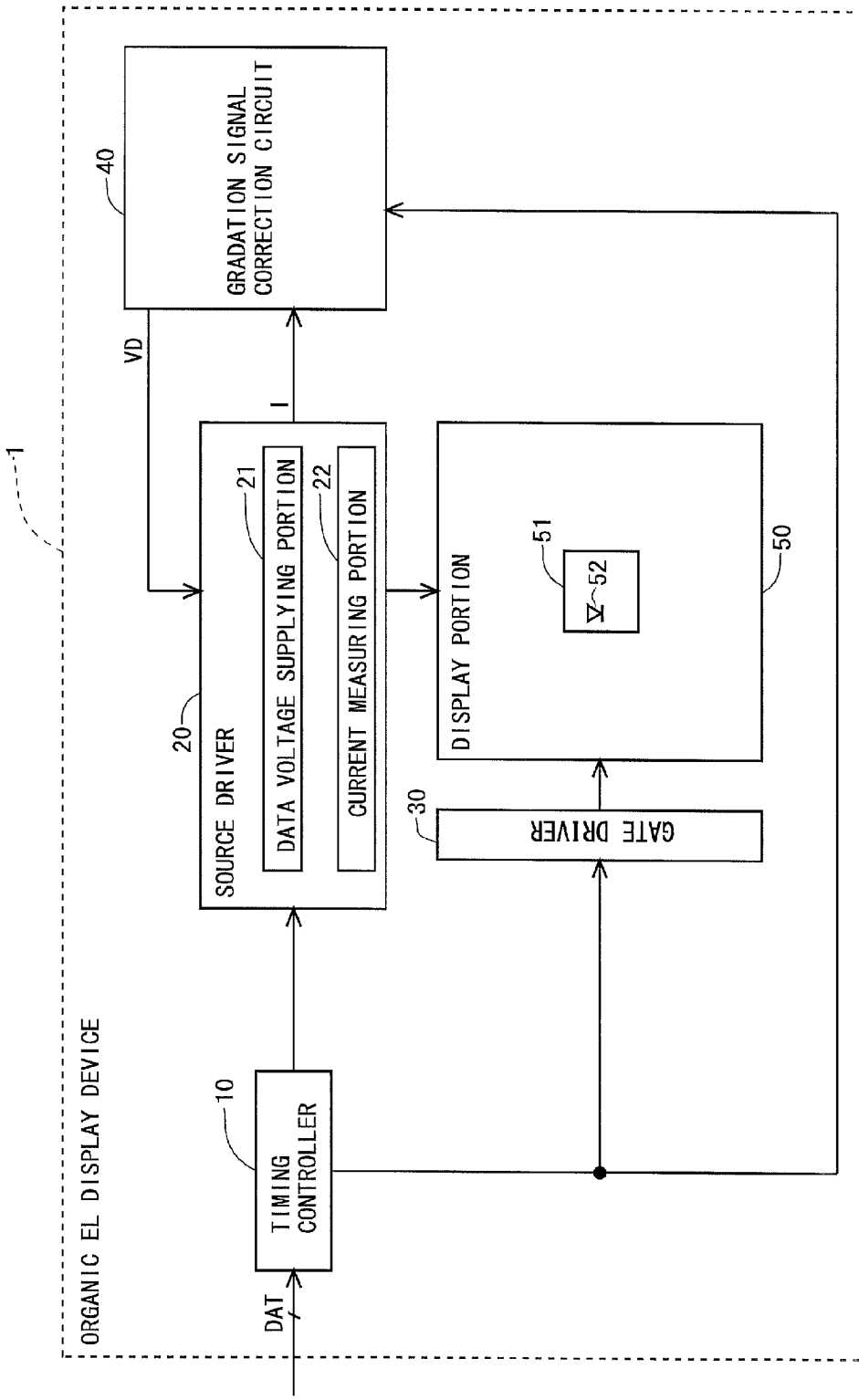
FIG. 2 is a block diagram showing a whole configuration of the active matrix type organic EL display device according to the first embodiment.

FIG. 2 is a block diagram showing a whole configuration of an active matrix type organic EL display device 1 according to a first embodiment of the present invention. This organic EL display device 1 includes a timing controller 10, a source driver 20, a gate driver 30, a gradation signal correction circuit 40, and a display portion 50. The source driver 20 includes a data voltage supplying portion 21 and a current measuring portion 22. It should be noted that either the source driver 20 or the gate driver 30, or both of them, may be configured to be integrally formed with the display portion 50. The display portion 50 is formed with a plurality of pixel circuits 51 including an OLED 52 as an electric optical element. A detailed configuration of the pixel circuit 51 will be described later. It should be noted that FIG. 2 shows only one pixel circuit 51.

Figure 3:
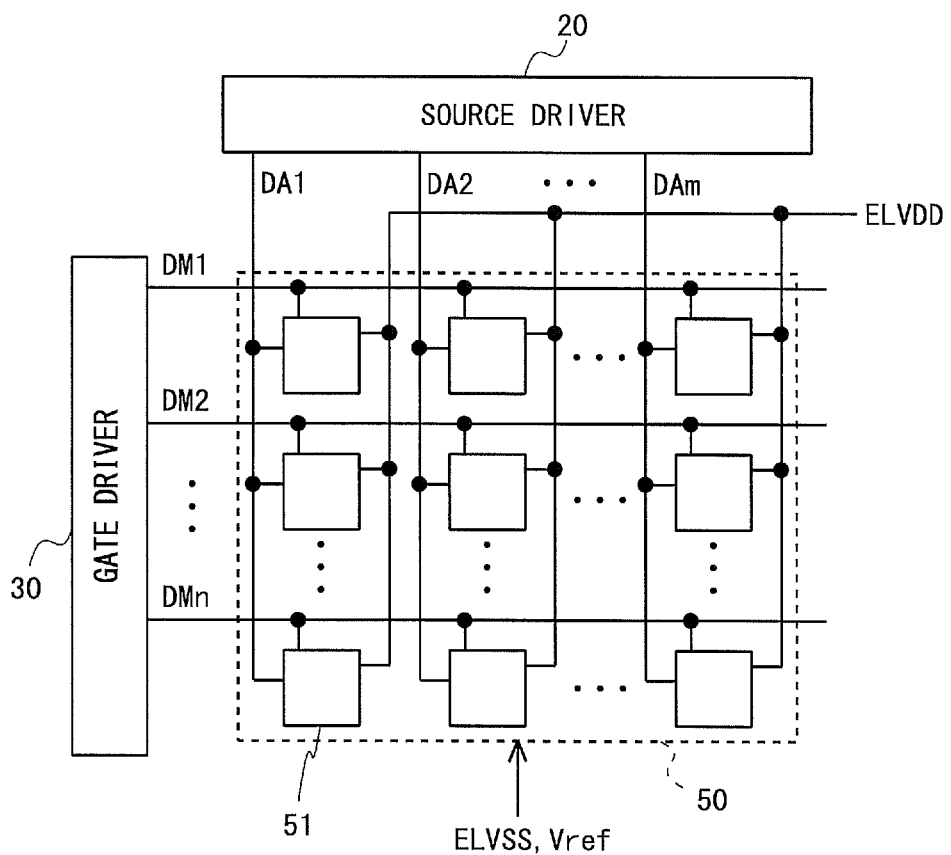
FIG. 3 is a block diagram for describing a configuration of a display portion shown in FIG. 2 in the first embodiment.

FIG. 3 is a block diagram for describing a configuration of the display portion 50 shown in FIG. 2. In the display portion 50, m data lines DA1 to DAm and n scanning lines DM1 to DMn orthogonal to the m data lines DA1 to DAm are arranged. The display portion 50 is also provided with m×n pixel circuits 51 corresponding to intersections of the m data lines DA1 to DAm and the n scanning lines DM1 to DMn. It should be noted that, in the following, when there is no need for distinguishing the data lines DA1 to DAm from each other, these are simply represented by symbol DA, and when there is no need for distinguishing the n scanning lines DM1 to DMn from each other, these are simply represented by symbol DM. Each of the pixel circuits 51 forms any of a red sub-pixel (R sub-pixel), a green sub-pixel (G sub-pixel), and a blue sub-pixel (B sub-pixel). The pixel circuits 51 arrayed in a row direction (crosswise direction in FIG. 3), for example, form the R sub-pixel, the G sub-pixel, and the B sub-pixel sequentially from the left. It should be noted that a kind of the sub-pixel is not restricted to red, green, and blue. Cyan, magenta, yellow, and the like may be employed.

Further, the display portion 50 is disposed with: a power supply line for supplying a high level power supply voltage ELVDD (hereinafter referred to as "high level power supply line"); a power supply line for supplying a low level power supply voltage ELVSS (hereinafter referred to as "low level power supply line"); and a line for supplying a reference voltage Vref (hereinafter referred to as "reference voltage line"). The high level power supply voltage ELVDD, the low level power supply voltage ELVSS, and the reference voltage Vref are constant voltages. Further, the low level power supply voltage ELVSS is, for example, a ground voltage. It should be noted that the power supply line for supplying the high level power supply voltage ELVDD is represented by ELVDD which is the same symbol as that of the high level power supply voltage, the power supply line for supplying the low level power supply voltage ELVSS is represented by ELVSS which is the same symbol as that of the low level power supply voltage, and the line for supplying the reference voltage Vref is represented by Vref which is the same symbol as that of the reference voltage.

Next, an operation of each constitutional element shown in FIG. 2 will be described. The timing controller 10 controls operations of the source driver 20, the gate driver 30, and the gradation signal correction circuit 40 based on an image signal DAT transmitted from the outside. More specifically, the timing controller 10 transmits a variety of control signals to the source driver 20 and the gate driver 30 and transmits a gradation signal and a variety of control signals to the gradation signal correction circuit 40, thereby controlling the operations of the source driver 20, the gate driver 30, and the gradation signal correction circuit 40.

The source driver 20 supplies a data voltage to the data line DA and measures a drive current at each pixel based on a driving gradation signal VD that is transmitted from the gradation signal correction circuit 40, in accordance with the control signal transmitted from the timing controller 10. The data voltage supplying portion 21 supplies a data voltage based on the driving gradation signal VD to the data line DA. The current measuring portion 22 measures a drive current obtained from the pixel circuit 51 in accordance with the data voltage based on the driving gradation signal VD corresponding to a predetermined gradation value, and acquires pixel current data I as data representing a magnitude of the drive current by a digital value. In the present embodiment, this pixel current data I is compensating data. Further, the current measuring portion 22 transmits the acquired pixel current data I to the gradation signal correction circuit 40. It should be noted that a configuration and an operation of the source driver 20 will be described in detail later. The gate driver 30 sequentially selects the n scanning lines DM1 to DMn in accordance with the control signal transmitted from the timing controller 10.

The gradation signal correction circuit 40 performs correction of the gradation signal transmitted from the timing controller 10 based on the pixel current data I, and gives the source driver 20 the driving gradation signal VD obtained by the correction.

In the manner as thus described, by the data voltage being applied to the m data lines DA1 to DAm and by the n scanning lines DM1 to DMn being sequentially selected, an image based on the image signal DAT is displayed on the display portion 50.

One frame period is made up of a normal display period and a vertical flyback period. In the present embodiment, a part of the vertical flyback period is used as a current value measurement period for acquiring the pixel current data I. In the current value measurement period within one vertical flyback period, for example, a predetermined number of scanning lines DM (p scanning lines DM) out of the n scanning lines DM are sequentially selected. Then, the pixel current data I is acquired by measuring a drive current in the pixel circuit 51 connected to the selected scanning line DM. The gate driver 30 shifts the p scanning lines DM to be selected with respect to each vertical flyback period (i.e., with respect to each one frame period). Therefore, assuming that a drive current is measured in each of the pixel circuits 51 corresponding to the scanning lines DM1 to DMp for the first to pth rows in the vertical flyback period of a certain frame period, a drive current is measured in each of the pixel circuits 51 corresponding to the scanning lines DMp+1 to DM2p for the (p+1)th to 2 pth rows in the vertical flyback period of the subsequent frame period. In such a manner, measurement of a drive current in each of the m×p pixel circuits 51 can be performed by sequentially shifting the m×p pixel circuits 51 as measurement objects with respect to each one frame period without overlapping.

Assuming, for example, that a display panel in the present embodiment is an FHD (Full High Definition) system, a total number of scanning lines is 1125 and the number of effective scanning lines is 1080. The number n of scanning lines DM corresponds to the number of effective scanning lines. In the FHD system, since one frame period is 1125H periods and a video signal period (normal display period) is 1080H periods, the vertical flyback period is 45H periods. In the present embodiment, p=9 is set, and nine scanning lines DM are sequentially selected in each 5H periods in the vertical flyback period. When p=9 is set in the FHD system as thus described, it is possible to measure a drive current in all the pixel circuits 51 in 120 frames (1080 rows/9 rows), namely two seconds. It should be noted that the value of p, the length of the period for selecting the scanning lines DM, and the like shown here are mere examples, and the present invention is not restricted to these.

<1.2 Source Driver>

Figure 4:
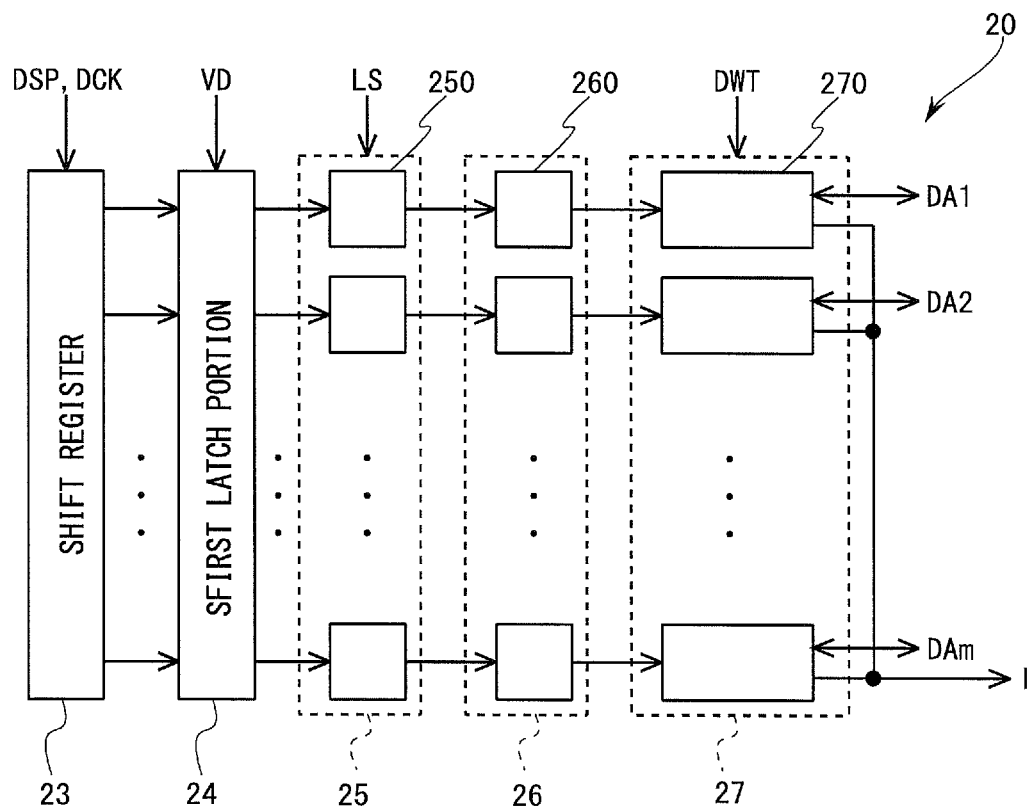
FIG. 4 is a block diagram showing a detailed configuration of a source driver in the first embodiment.

FIG. 4 is a block diagram showing a detailed configuration of the source driver 20. The source driver 20 is provided with a shift register 23, a first latch portion 24, a second latch portion 25, a D/A converting portion 26, and a voltage output and current measuring portion 27. The second latch portion 25 is provided with m latch circuits 250 respectively corresponding to the m data lines DA1 to DAm. The D/A converting portion 26 is provided with m D/A converters (hereinafter referred to as "DAC") 260 respectively corresponding to the m data lines DA1 to DAm. The voltage output and current measuring portion 27 is provided with m voltage output and current measurement circuits 270 respectively corresponding to the m data lines DA1 to DAm. The timing controller 10 gives, to this source driver 20, a data start pulse DSP, a data clock DCK, a latch strobe signal LS, and an input-and-output control signal DWT as the variety of control signals. The gradation signal correction circuit 40 gives the driving gradation signal VD to this source driver 20. It should be noted that, in the normal display period, a value of the driving gradation signal VD (gradation value) is a value corresponding to a display image as a target at each pixel, and in the current value measurement period, a value of the driving gradation signal VD is a predetermined value for measuring a drive current.

The data start pulse DSP and the data clock DCK are inputted into the shift register 23. The shift register 23 sequentially transmits a pulse included in the data start pulse DSP from an input end to an output end based on the data clock DCK. In accordance with this transfer of the pulse, a sampling pulse corresponding to each data line DA is sequentially outputted from the shift register 23, and the sampling pulse is sequentially inputted into the first latch portion 24. The first latch portion 24 sequentially stores values of the driving gradation signals VD for one row at the timing of the sampling pulse. Each latch circuit 250 fetches and holds a gradation value of a corresponding column out of the gradation values for one row stored in the first latch portion 24 in accordance with the latch strobe signal LS. Further, each latch circuit 250 gives the holding gradation value to the corresponding DAC 260, as internal gradation data. Each DAC 260 selects a gradation voltage in accordance with the internal gradation data outputted from the corresponding latch circuit 250, and gives the gradation voltage to the corresponding voltage output-and-current measurement circuit 270, as a data voltage.

The voltage output and current measurement circuit 270 performs a different operation in accordance with the level of the input-and-output control signal DWT. When the input-and-output control signal DWT is on a level "1" (high level in the present specification), the voltage output and current measurement circuit 270 supplies the data voltage outputted from the DAC 260 to the corresponding data line DA. When the input-and-output control signal DWT is on a level "0" (low level in the present specification), the voltage output and current measurement circuit 270 measures a value of the drive current (current value) outputted from the pixel circuit 51 to the corresponding data line DA. The pixel current data I obtained by the measurement is transmitted from the voltage output and current measurement circuit 270 to the gradation signal correction circuit 40.

It should be noted that the current measuring portion 22 (see FIG. 2) is made up of part of the voltage output and current measuring portion 27, and the data voltage supplying portion 21 (see FIG. 2) is made up of the remaining part of the voltage output and current measuring portion 27, the shift register 23, the first latch portion 24, the second latch portion 25, and the D/A converting portion 26.

<1.3 Pixel Circuit and Constitutional Elements for Measuring Drive Current>

Figure 5:
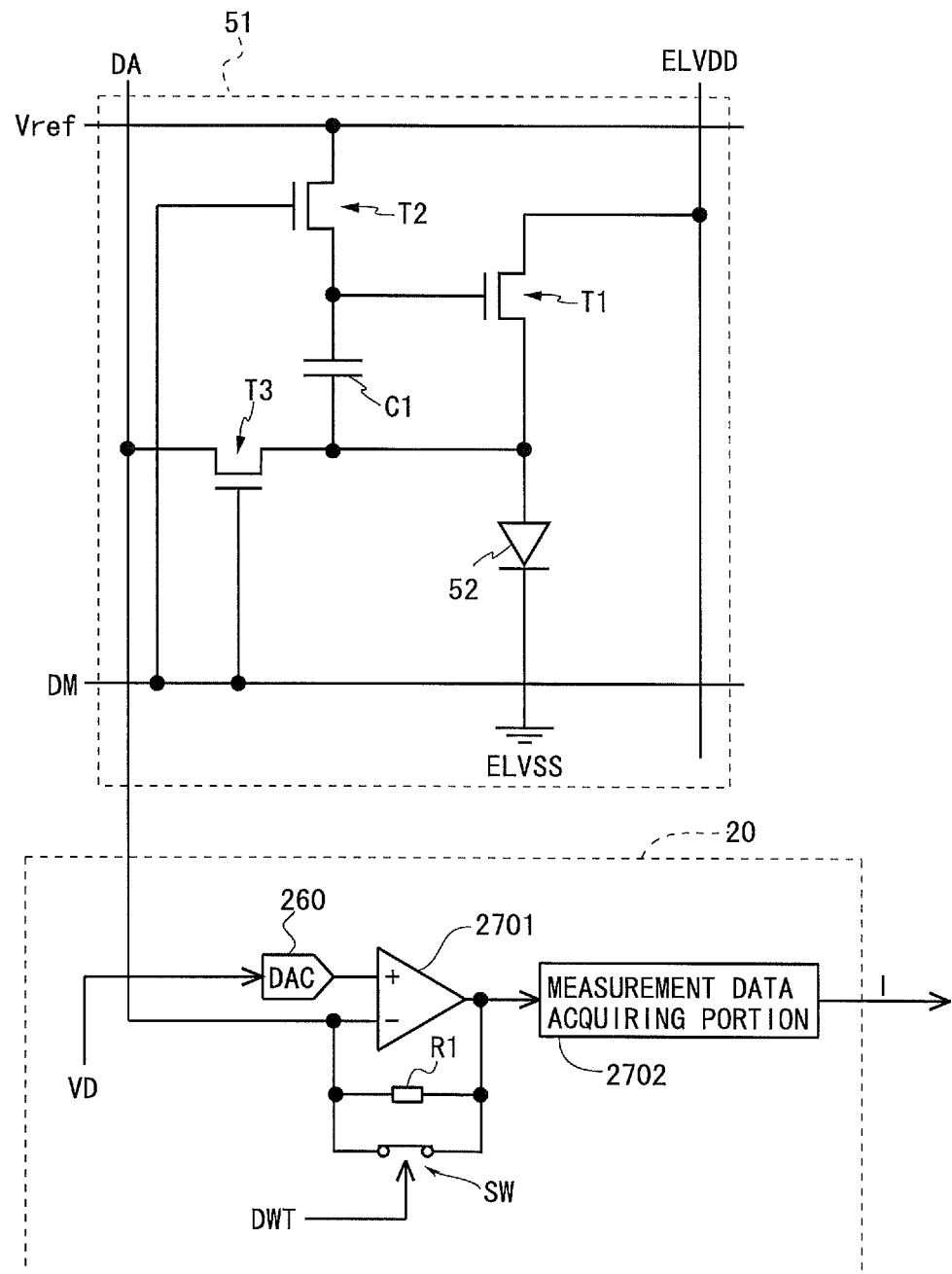
FIG. 5 is a circuit diagram showing a pixel circuit and constitutional elements for measuring a drive current (part of constitutional elements of a source driver) in the first embodiment.

FIG. 5 is a circuit diagram showing the pixel circuit 51 and constitutional elements for measuring a drive current (part of constitutional elements of the source driver 20) in the present embodiment. The pixel circuit 51 is provided with one OLED 52, three transistors T1 to T3, and one capacitor C1. The transistor T1 is a drive transistor, the transistor T2 is a reference voltage supply transistor, and the transistor T3 is an input transistor.

In the present embodiment, all of the transistors T1 to T3 are n-channel type transistors. Further, in the present embodiment, an oxide TFT (thin film transistor using an oxide semiconductor for a channel layer) is employed for each of the transistors T1 to T3. Specifically, there is employed an IGZO-TFT where a channel layer is formed of InGaZnOx (indium gallium zinc oxide) (hereinafter referred to as "IGZO") which is an oxide semiconductor mainly composed of indium (In), gallium (Ga), zinc (Zn), and oxygen (O). It should be noted that an oxide TFT such as an IGZO-TFT is effective especially in the case of being employed as the n-channel type transistor included in the pixel circuit 51. However, the present invention does not exclude the use of a p-channel type oxide TFT. Further, it is also possible to employ a transistor using an oxide semiconductor other than IGZO for the channel layer. For example, a similar effect is obtained in the case of employing a transistor using, for the channel layer, an oxide semiconductor containing at least one of indium, gallium, zinc, copper (Cu), silicon (Si), tin (Sn), aluminum (Al), calcium (Ca), germanium (Ge), and lead (Pb).

The transistor T1 is provided in series with the OLED 52. As for this transistor T1, a drain terminal is connected to a high level power supply line ELVDD, and a source terminal is connected to an anode terminal of the OLED 52. The transistor T2 is provided between a reference voltage line Vref and a gate terminal of the transistor T1. A gate terminal of the transistor T2 is connected to the scanning line DM. The transistor T3 is provided between the data line DA and the source terminal of the transistor T1. A gate terminal of the transistor T3 is connected to the scanning line DM. The capacitor C1 is provided between the gate terminal and the source terminal of the transistor T1. A cathode terminal of the OLED 52 is connected to the low level power supply line ELVSS.

The source driver 20 includes the DAC 260, an operational amplifier 2701, a resistor element R1, a control switch SW, and a measurement data acquiring portion 2702. It should be noted that the DAC 260 is a constitutional element of the data voltage supplying portion 21, the operational amplifier 2701 and the control switch SW are constitutional elements shared by the data voltage supplying portion 21 and the current measuring portion 22, and the resistor element R1 and the measurement data acquiring portion 2702 are constitutional elements of the current measuring portion 22. The resistor element R1 functions as a current voltage conversion element.

A non-reversal input terminal of the operational amplifier 2701 is connected to an output terminal of the DAC 260, and a reversal input terminal of the operational amplifier 2701 is connected to the corresponding data line DA. The resistor element R1 and the control switch SW are connected in parallel between an output terminal and the reversal input terminal of the operational amplifier 2701. The control switch SW is controlled by the input-and-output control signal DWT transmitted from the timing controller 10, for example. When the input-and-output control signal DWT is on the level "1", the control switch SW is in a closed state. When the input-and-output control signal DWT is on the level "0", the control switch SW is in an open state. The measurement data acquiring portion 2702 acquires the pixel current data I as measurement data based on output from the operational amplifier 2701. That pixel current data I is transmitted to the gradation signal correction circuit 40.

When the input-and-output control signal DWT is on the level "1", the control switch SW is closed, and hence the output terminal and the reversal input terminal of the operational amplifier 2701 are short-circuited. For this reason, when the input-and-output control signal DWT is on the level "1", the operational amplifier 2701 functions as a buffer amplifier. Hence, a data voltage based on the driving gradation signal VD is supplied to the data line DA with a low output impedance. At this time, it is desirable to prevent a data voltage from being imputed into the measurement data acquiring portion 2702 by controlling the measurement data acquiring portion 2702 by the input-and-output control signal DWT, or by some other means.

When the input-and-output control signal DWT is on the level "0", the control switch SW is open, and hence the output terminal and the reversal input terminal of the operational amplifier 2701 are connected to each other via the resistor element R1. Hence, the operational amplifier 2701 functions as a current amplification amplifier taking the resistor element R1 as a feedback resistor. At this time, when a data voltage is inputted into the non-reversal input terminal of the operational amplifier 2701, a potential of the reversal input terminal is almost equal to a potential of the data voltage by a virtual short circuit. Further, at this time, a drive current, which flows in accordance with a gate-source voltage Vgs (of the transistor T1) based on the data voltage, is outputted from the pixel circuit 51 to the data line DA. This allows the measurement data acquiring portion 2702 to acquire the foregoing pixel current data I.

<1.3.1 Operation in Normal Display Period>

Figure 6:
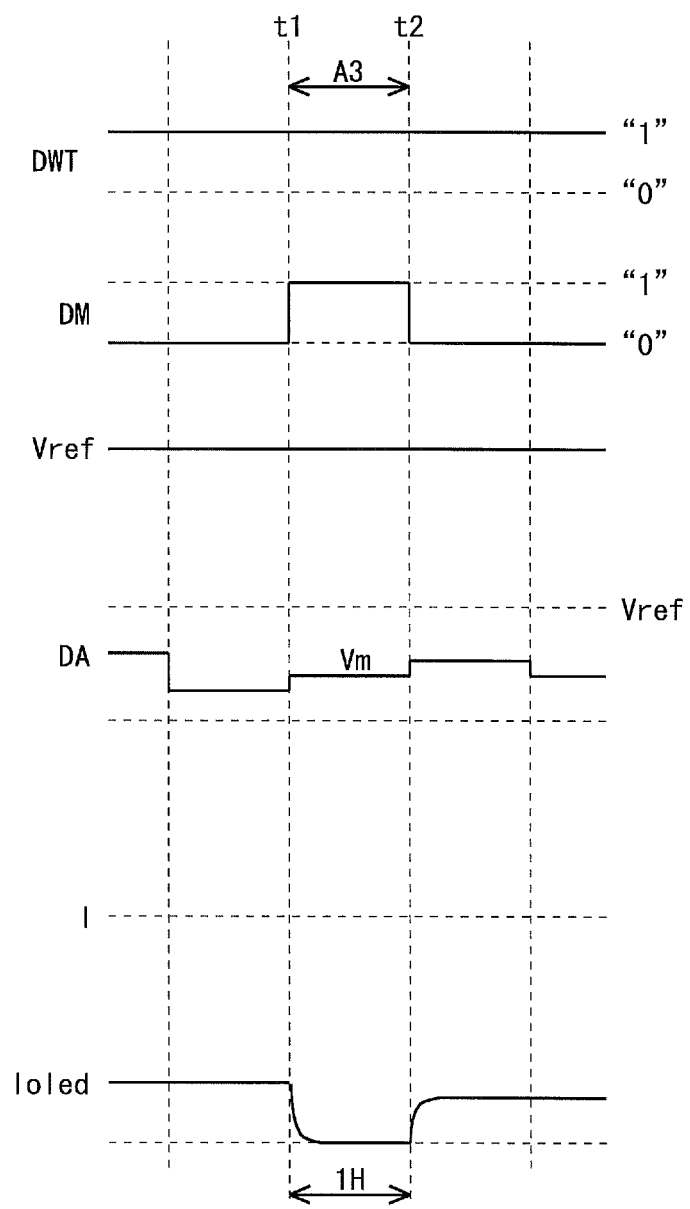
FIG. 6 is a timing chart for describing operations of the pixel circuit and the part of the constitutional elements of the source driver in a normal display period in the first embodiment.

FIG. 6 is a timing chart for describing operations of the pixel circuit 51 and the part of the constitutional elements of the source driver 20 in the normal display period. It is assumed that a data voltage Vm is to be written in a period A3 from time t1 to time t2 in the pixel circuit 51 focused here.

The n scanning lines DM are sequentially selected in the normal display period. Further, the input-and-output control signal DWT is on the level "1" in the normal display period. Hence, the operational amplifier 2701 functions as a buffer amplifier, as described above.

The scanning line DM is on the level "0" before the time t1. At this time, the transistors T2 and T3 are in an off-state, and a drive current in accordance with the gate-source voltage Vgs held in the capacitor C1 flows in the transistor T1. The OLED 52 emits light with a luminance in accordance with this drive current. Hereinafter, in the case of distinguishing the drive current flowing in the transistor T1 and the drive current flowing in the OLED 52, the drive current flowing in the OLED 52 is referred to as a light-emitting drive current Ioled.

At the time t1, the data voltage Vm is supplied to the data line DA via the operational amplifier 2701. Further, the scanning line DM shifts to the level "1", and the transistors T2 and T3 are turned on. Therefore, the data voltage Vm is given to one end of the capacitor C1 (the source terminal of the transistor T1) via the data line DA and the transistor T3, and the reference voltage Vref is given to the other end of the capacitor C1 (the gate terminal of the transistor T1) via the transistor T2. Accordingly, the capacitor C1 is charged with the gate-source voltage Vgs given by the following formula (1) in the period A3 from the time t1 to the time t2:

$$Vgs = Vref - Vm \quad (1)$$

It should be noted that, when a threshold voltage of the OLED 52 is assumed to be Vtholed, the data voltage Vm is desirably set to a value given by the following formula (2):

$$Vm < ELVSS + Vtholed \quad (2)$$

The data voltage Vm set as in the formula (2) is given to the anode terminal of the OLED 52 (the source terminal of the transistor T1), and thus the light-emitting drive current Ioled becomes 0 in the period A3 (the same applies to periods A1, A2 described later). This allows light emission of the OLED 52 to be stopped.

At the time t2, the scanning line DM shifts to the level "0", and the transistors T2 and T3 are turned off. Therefore, a holding voltage of the capacitor C1 is decided to be the gate-source voltage Vgs shown in the formula (1). At this time, since the source terminal of the transistor T1 is electrically cut off from the data line DA, the light-emitting drive current Ioled in accordance with the gate-source voltage Vgs flows, and the OLED 52 emits light with a luminance in accordance with the light-emitting drive current Ioled. In the manner as thus described, in the normal display period, the OLED 52 in each of the pixel circuits 51 emits light with a luminance in accordance with the image signal DAT transmitted from the outside.

<1.3.2 Operation in Current Value Measurement Period>

Figure 7:
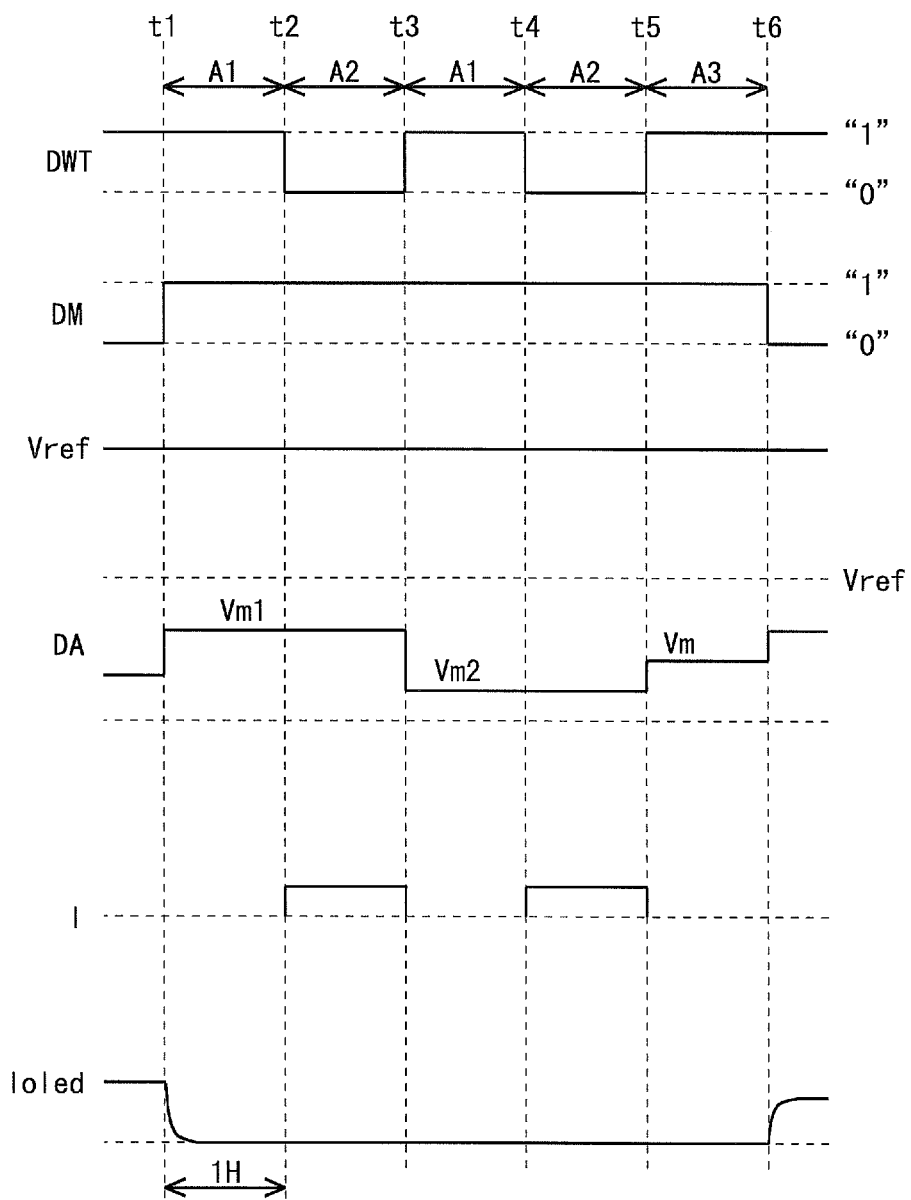
FIG. 7 is a timing chart for describing operations of the pixel circuit and the part of the constitutional elements of the source driver in a current value measurement period in the first embodiment.

FIG. 7 is a timing chart for describing operations of the pixel circuit 51 and the part of the constitutional elements of the source driver 20 in the current value measurement period. Each of a period A1 from time t1 to time t2 and a period A1 from time t3 to time t4 is a period for writing into the pixel circuit 51 a data voltage (hereinafter simply referred to as "measuring data voltage") which corresponds to a gradation value (hereinafter referred to as "measuring gradation value") for use in measurement of a drive current. Each of a period A2 from the time t2 to the time t3 and a period A2 from the time t4 to time t5 is a period for measuring a drive current in accordance with the measuring data voltage.

In the present embodiment, gradation values on two standards (first standard and second standard) are used as measuring gradation values. That is, two voltages respectively corresponding to measuring gradation values on the two standards are taken as measuring data voltages. For example, a relatively high-level gradation value is employed as the measuring gradation value on the first standard, and a relatively low-level gradation value is employed as the measuring gradation value on the second standard. Examples thereof are that the measuring gradation value on the first standard is set to "186" (a level on which an average luminance becomes 150 nit) and that the measuring gradation value on the second standard is set to "82" (a level on which an average luminance becomes 25 nit). Hereinafter, the measuring data voltage corresponding to the measuring gradation value on the first standard is referred to as a "first measuring data voltage", and the measuring data voltage corresponding to the measuring gradation value on the second standard is referred to as a "second measuring data voltage". Symbol Vm1 is assigned to the first measuring data voltage, and symbol Vm2 is assigned to the second measuring data voltage.

As shown in FIG. 7, in 5H periods from the time t1 to time t6 where the scanning line DM in on the level "1", the level of the input-and-output control signal DWT switches in the order of the level "1", the level "0", level "1", the level "0", and the level "1" for each 1H period. As described above, the operational amplifier 2701 functions as the buffer amplifier when the input-and-output control signal DWT is on the level "1", and the operational amplifier 2701 functions as the current amplification amplifier when the input-and-output control signal DWT is on the level "0".

Before the time t1, the scanning line DM is on the level "0". At this time, the transistors T2 and T3 are in the off-state, and the transistor T1 allows a drive current in accordance with the gate-source voltage Vgs held in the capacitor C1 to flow. The drive current flowing in the transistor T1 flows in the OLED 52 as the light-emitting drive current Ioled. Then, the OLED 52 emits light with a luminance in accordance with this light-emitting drive current Ioled.

At the time t1, the scanning line DM shifts to the level "1", and the transistors T2 and T3 are turned on. Further, the input-and-output control signal DWT enters the level "1", and the control switch SW is closed. Moreover, the first measuring data voltage Vm1 is inputted into the non-reversal input terminal of the operational amplifier 2701. Therefore, as shown in FIG. 7, the first measuring data voltage Vm1 is supplied to the data line DA. Accordingly, similarly to the period A3 (see FIG. 6), the capacitor C1 is charged with the gate-source voltage Vgs given by the following formula (3) in the period A1 from the time t1 to the time t2:

$$Vgs=Vref-Vm1 \tag{3}$$

At the time t2, the input-and-output control signal DWT shifts to the level "0", and the control switch SW is opened. Further, since the first measuring data voltage Vm1 is inputted into the non-reversal input terminal of the operational amplifier 2701 continuously from the time t1, the potential of the reversal input terminal is also Vm1 due to a virtual short circuit. It should be noted that, since the data line DA is already charged with the first measuring data voltage Vm1 in the period A1 from the time t1 to the time t2, a short amount of time is required for the potential of the reversal input terminal to become Vm1 as thus described. In the period A2 from the time t2 to the time t3, a current path of the drive current via the transistor T3 in an on-state is formed, and the drive current is outputted from the pixel circuit 51 to the data line DA. It should be noted that, from the formula (2), the light-emitting drive current Ioled does not flow. As thus described, the transistor T3 can output a drive current to the data line DA when it is in the on state. Then, measurement of the drive current outputted to the data line DA is performed in the measurement data acquiring portion 2702 (see FIG. 5), and the pixel current data I corresponding to the first measuring data voltage Vm1 is acquired.

In the period A1 from the time t3 to the time t4, similarly to the period A1 from the time t1 to the time t2, the capacitor C1 is charged with a gate-source voltage in accordance with the second measuring data voltage Vm2. In the period A2 from the time t4 to the time t5, similarly to the period A2 from the time t2 to the time t3, the pixel current data I corresponding to the second measuring data voltage Vm2 is acquired. An operation in the period A3 from the time t5 to the time t6 is similar to that in the normal display period, and hence a description thereof will be omitted.

In the manner as thus described, in the current value measurement period in one vertical flyback period, the pixel current data I corresponding to the first measuring data voltage Vm1 and the pixel current data I corresponding to the second measuring data voltage Vm2 are acquired with respect to each of the (m×p) pixel circuits 51 corresponding to p scanning lines DM.

<1.4 Gradation Signal Correction Circuit>

Figure 8:
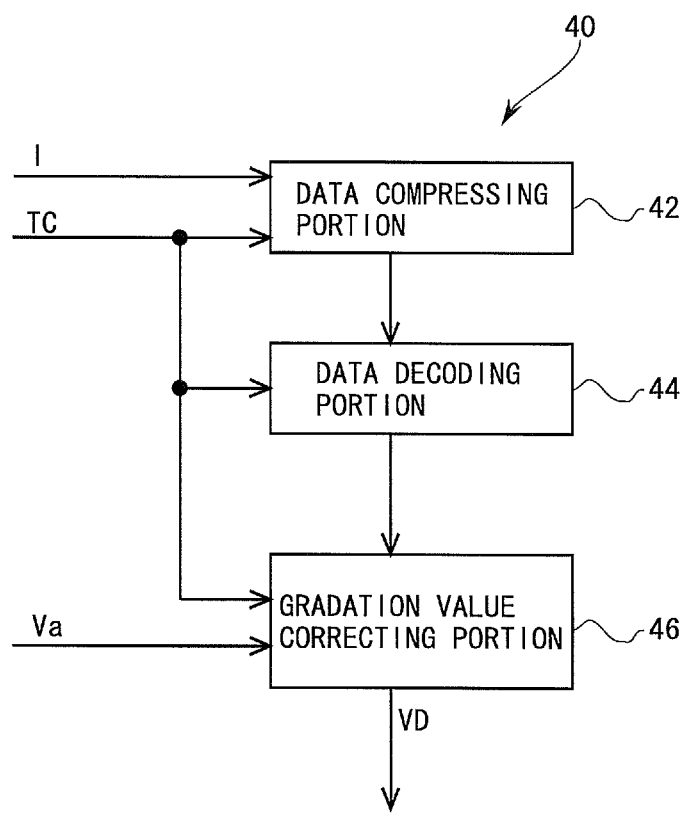
FIG. 8 is a block diagram showing a schematic configuration of a gradation signal correction circuit in the first embodiment.

FIG. 8 is a block diagram showing a schematic configuration of the gradation signal correction circuit 40. The gradation signal correction circuit 40 is constituted by a data compressing portion 42, a data decoding portion 44, and a gradation value correcting portion 46. The data compressing portion 42 compresses the pixel current data I transmitted from the source driver 20 based on a control signal TC transmitted from the timing controller 10. The data decoding portion 44 decodes the pixel current data I compressed by the data compressing portion 42 based on the control signal TC transmitted from the timing controller 10. The gradation value correcting portion 46 generates the driving gradation signal VD corresponding to each pixel based on the control signal TC and a gradation signal Va transmitted from the timing controller 10. At this time, in order to suppress "occurrence of burning and variations in luminance" caused by "variations in characteristic of the drive transistor (transistor T1 in FIG. 5) or time degradation of the OLED 52", a predetermined correction is performed on a gradation value of the gradation signal Va. It should be noted that compression of the pixel current data I in the data compressing portion 42, decoding of the pixel current data I in the data decoding portion 44, and correction of the gradation signal Va in the gradation value correcting portion 46 will be described in detail later.

<1.5 Compression and Decoding of Pixel Current Data>
<1.5.1 Summary of Compression and Decoding>

FIG. 1 is a block diagram for describing compression and decoding of the pixel current data I. It should be noted that, in the following, the whole of the constitutional elements shown in FIG. 1 is referred to as a "pixel current data compressing-and-decoding portion". The pixel current data compressing-and-decoding portion includes a low pass filter (a high frequency component removing filter) 421, a first computing portion 422, a down-sampling portion 426, a high frequency signal compression processing portion 427, a storage portion (memory) 480, a memory controller 482, a post filter up-sampling portion 443, a high frequency signal decoding processing portion 444, and a second computing portion 446. The low pass filter 421, the first computing portion 422, the down-sampling portion 426, and the high frequency signal compression processing portion 427 are constitutional elements of the data compressing portion 42. The post filter up-sampling portion 443, the high frequency signal decoding processing portion 444, and the second computing portion 446 are constitutional elements of the data decoding portion 44.

It should be noted that, in the present embodiment, the current data dividing portion is realized by the low pass filter 421 and the first computing portion 422, the high frequency component computing portion is realized by the first computing portion 422, the low frequency component data compression processing portion is realized by the down-sampling portion 426, and the high frequency component data compression processing portion is realized by the high frequency signal compression processing portion 427.

A summary of a function of each constitutional element included in the pixel current data compressing-and-decoding portion will be described. It should be noted that the pixel current data I acquired in the current measuring portion 22 of the source driver 20 is inputted into the pixel current data compressing-and-decoding portion. The low pass filter 421 functions as a filter for attenuating a high frequency component out of the pixel current data I and allowing passage of a low frequency component out of the pixel current data I. Hereinafter, the data outputted from the low pass filter 421 is referred to as "low frequency component data". Symbol IL is assigned to the low frequency component data. The first computing portion 422 obtains a difference between the pixel current data I and the low frequency component data IL. The data of the difference is outputted from the first computing portion 422 as the high frequency component out of the pixel current data I. Hereinafter, the data outputted from the first computing portion 422 is referred to as "high frequency component data". Symbol IH is assigned to the high frequency component data.

Figure 9:
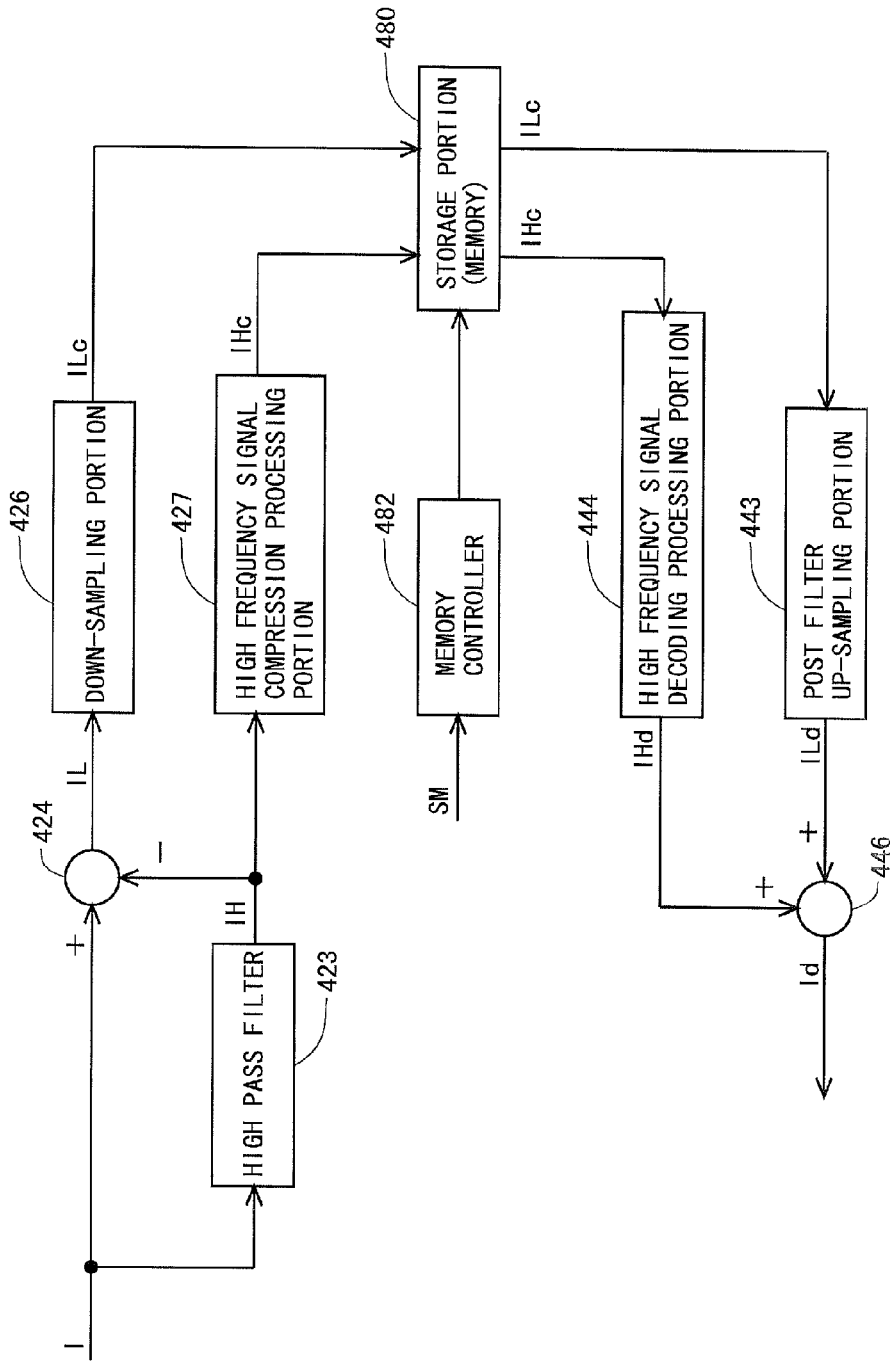
FIG. 9 is a block diagram showing a modification of a configuration of a pixel current data compressing-and-decoding portion.
Figure 10:
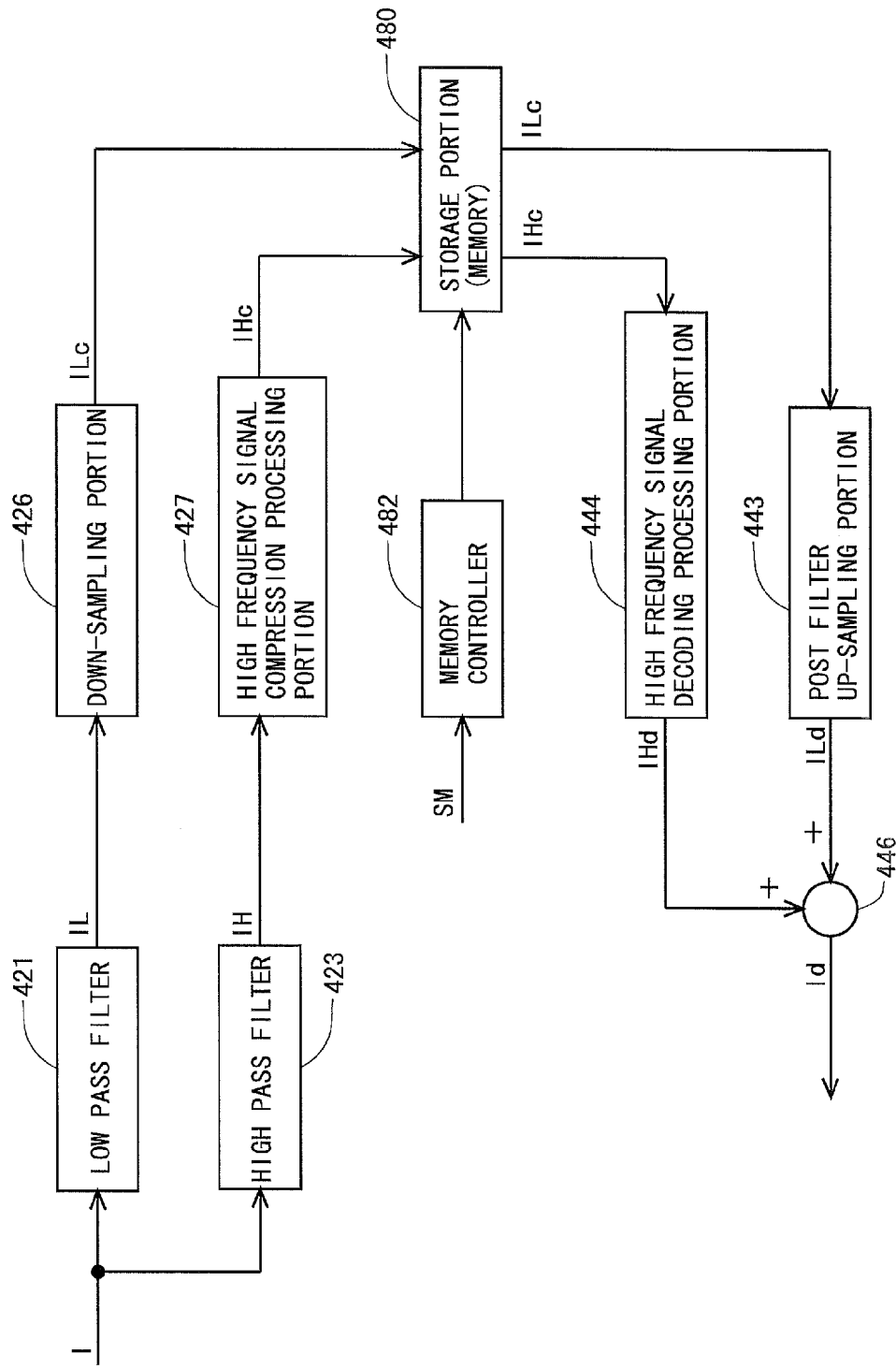
FIG. 10 is a block diagram showing a modification of the configuration of the pixel current data compressing-and-decoding portion.

It should be noted that, as shown in FIG. 9, the configuration may be such that a high pass filter (a low frequency component removing filter) 423 is provided in place of the low pass filter 421, and that the low frequency component data IL is obtained based on a difference between the high frequency component data IH outputted from the high pass filter 423 and the pixel current data I (the low frequency component data IL may be obtained by a computing portion (low frequency component computing portion) 424 of FIG. 9). Further, as shown in FIG. 10, the configuration may be such that both the low pass filter 421 and the high pass filter 423 are provided, and that while the low pass filter 421 is applied to the pixel current data I to obtain the low frequency component data IL, the high pass filter 423 is applied to the pixel current data I to obtain the high frequency component data IH.

The down-sampling portion 426 reduces an amount of the low frequency component data to be saved into the storage portion 480 by sampling data from the low frequency component data IL. That is, the low frequency component data IL is compressed in the down-sampling portion 426. Hereinafter, the data outputted from the down-sampling portion 426 is referred to as "compressed low frequency component data". Symbol ILc is added to the compressed low frequency component data. The high frequency signal compression processing portion 427 reduces an amount of the high frequency component data to be saved into the storage portion 480 by extracting data with a predetermined amplitude from the high frequency component data IH. That is, the high frequency component data IH is compressed in the high frequency signal compression processing portion 427. Hereinafter, the data outputted from the high frequency signal compression processing portion 427 is referred to as "compressed high frequency component data". Symbol IHc is assigned to the compressed high frequency component data.

The compressed low frequency component data ILc and the compressed high frequency component data IHc are saved into the storage portion (memory) 480. In accordance with a memory control signal SM given from the timing controller 10 or the like, the memory controller 482 controls writing of the compressed low frequency component data ILc and the compressed high frequency component data IHc into the storage portion 480 and reading of the compressed low frequency component data ILc and the compressed high frequency component data IHc from the storage portion 480. It should be noted that the storage portion 480 may or may not be configured such that the compressed low frequency component data ILc and the compressed high frequency component data IHc are simultaneously written and read.

The post filter up-sampling portion 443 decodes the compressed low frequency component data ILc read from the storage portion 480. Hereinafter, data outputted from the post filter up-sampling portion 443 is referred to as "decoded low frequency component data". Symbol ILd is assigned to the decoded low frequency component data. In this post filter up-sampling portion 443, the compressed low frequency component data ILc is decoded so as to come into a state completely before the compression. This is made possible by using the appropriate low pass filter 421 in accordance with a sampling interval (extraction interval) of data in the down-sampling portion 426 at the time of the compression processing (Nyquist's theorem). The high frequency signal decoding processing portion 444 decodes the compressed high frequency component data IHc read from the storage portion 480. Hereinafter, the data outputted from the high frequency signal decoding processing portion 444 is referred to as "decoded high frequency component data". Symbol IHd is assigned to the decoded high frequency component data. The second computing portion 446 performs processing of adding the decoded low frequency component data ILd and the decoded high frequency component data IHd, to obtain decoded pixel current data Id. It should be noted that the decoded pixel current data Id is equal to the pixel current data I when reversible compression is performed on the high frequency component data IH, and the decoded pixel current data Id is almost equal to the pixel current data I when irreversible compression is performed on the high frequency component data IH In the present embodiment, the pixel current data I is saved into the storage portion 480 by the following procedure. Every time the pixel current data I for one row is acquired in the foregoing current value measurement period, the pixel current data I for one row is temporarily stored into a first memory (not shown) previously prepared in the organic EL display device 1. Then, the compression processing as described above is performed on the pixel current data I saved in the first memory before the next pixel current data I for one row is acquired, and data obtained by the compression processing is saved into a second memory (the storage portion 480). Here, the first memory has at least a capacity which is large enough to save the pixel current data I for one low, and the second memory has at least a capacity which is large enough to save the data obtained by compressing the pixel current data I for all the pixels (the compressed low frequency component data ILc and the compressed high frequency component data IHc).

As described above, two pixel current data I (the pixel current data I corresponding to the first measuring data voltage Vm1 and the pixel current data I corresponding to the second measuring data voltage Vm2) are acquired for one pixel circuit (one sub-pixel). Therefore, the foregoing compression processing is performed on each of those two pixel current data I.

In the present embodiment, one pixel current data I is acquired with an accuracy of 10 bits. Hence, a data amount MA of the pixel current data I for one low of each color with respect to one standard is as follows. In addition, it is assumed here that a 5-type full HD (1920×1080×RGB) panel is employed.

$$MA = 10 \text{ bits} \times 1{,}920 \times 1 = 19{,}200 \text{ bits (18.75 kilobits)}$$

<1.5.2 View about Reduction in Data Amount>

Figure 11:
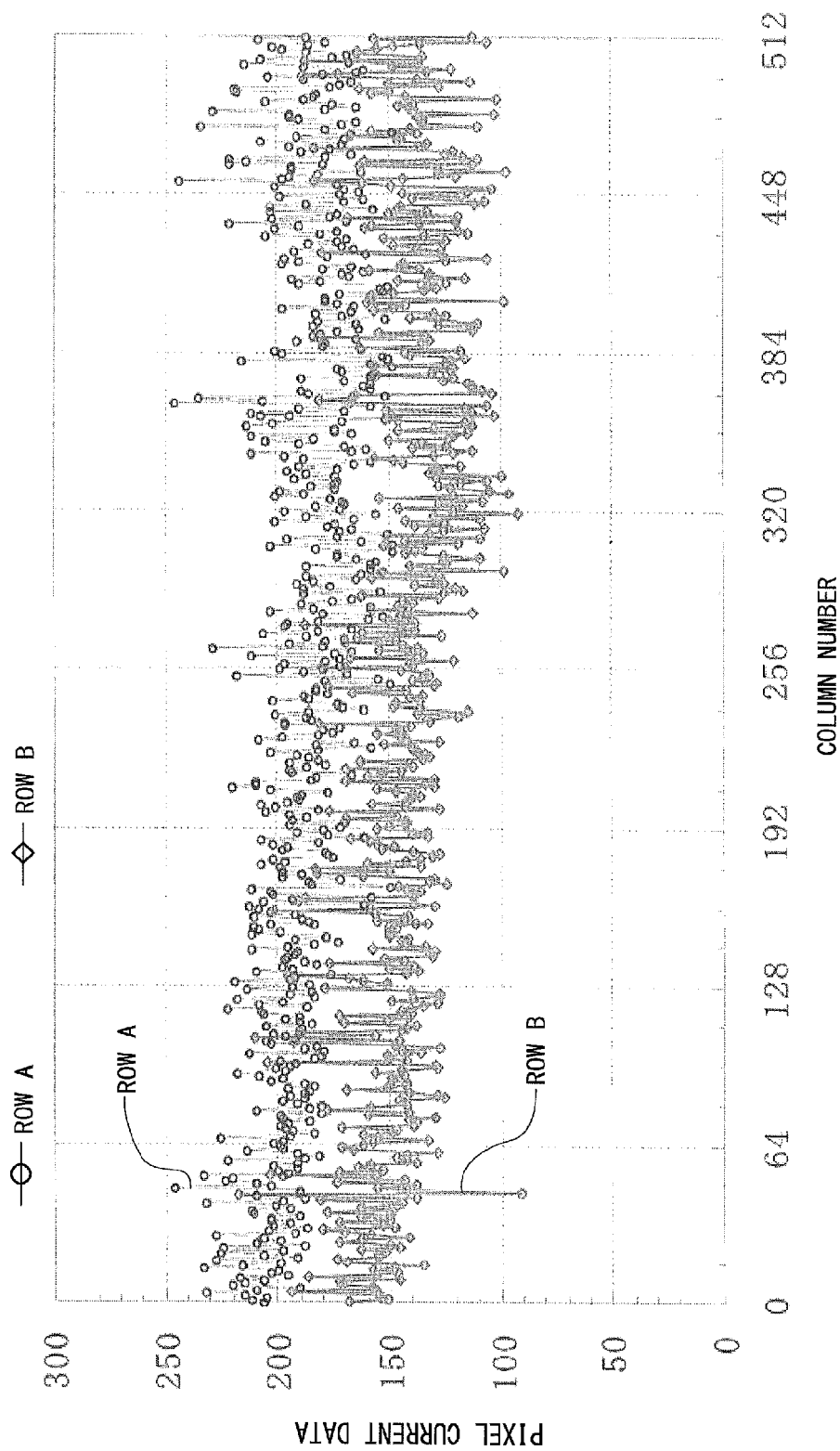
FIG. 11 is a diagram showing an example of pixel current data.
Figure 12:
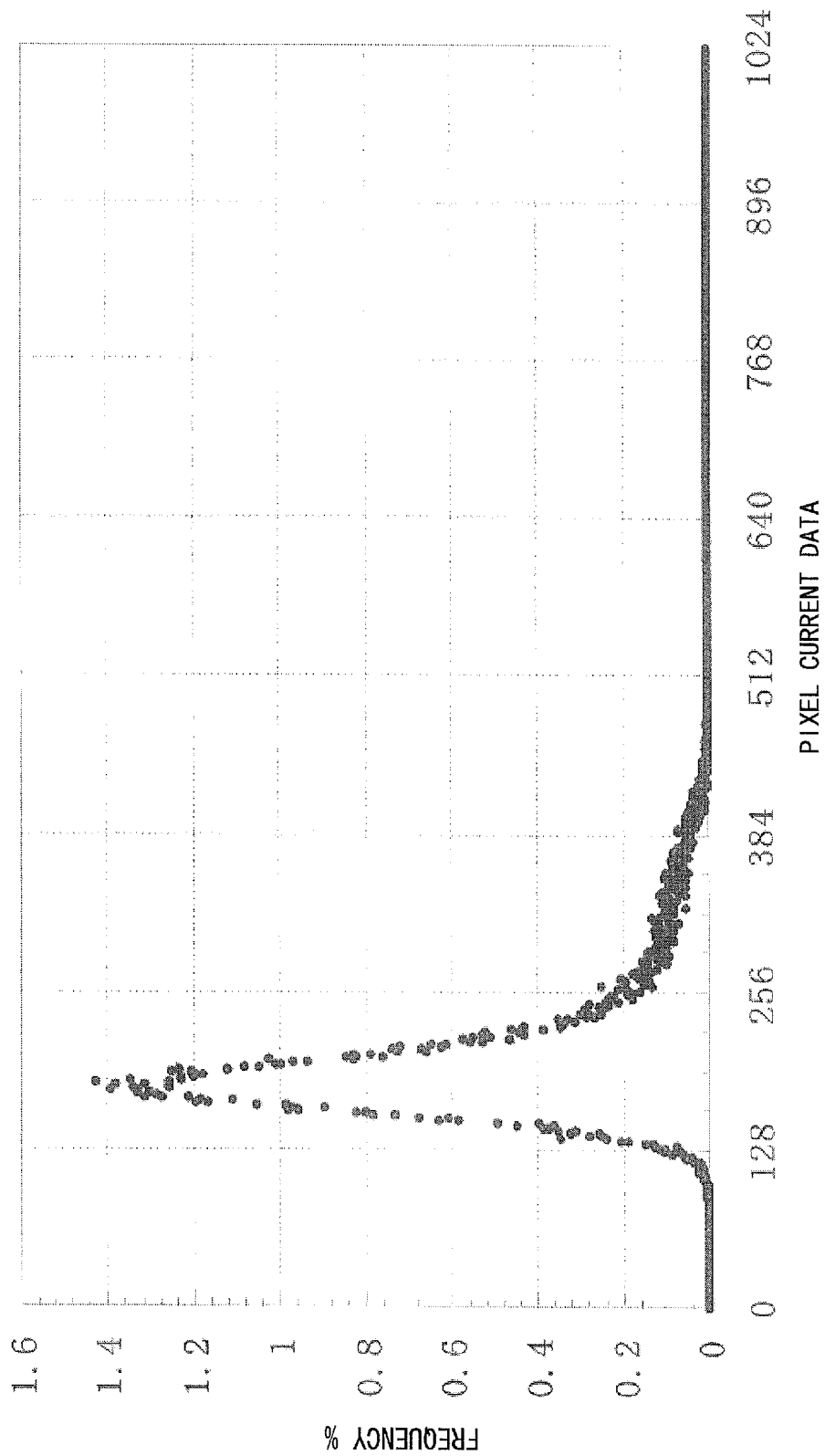
FIG. 12 is a histogram for the whole of the pixel current data.
Figure 13:
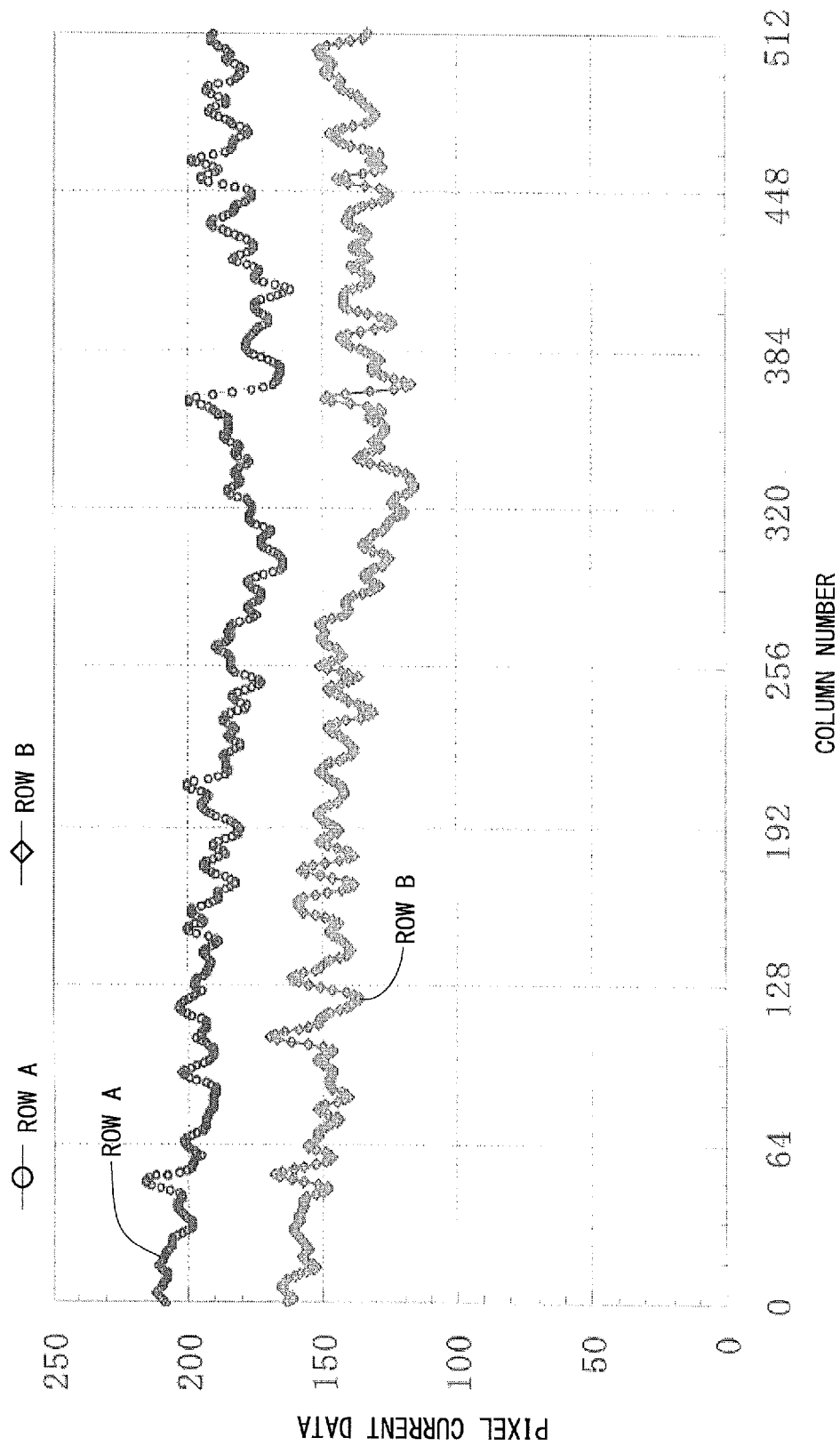
FIG. 13 is a diagram showing low frequency components of pixel current data of first to 512th columns.
Figure 14:
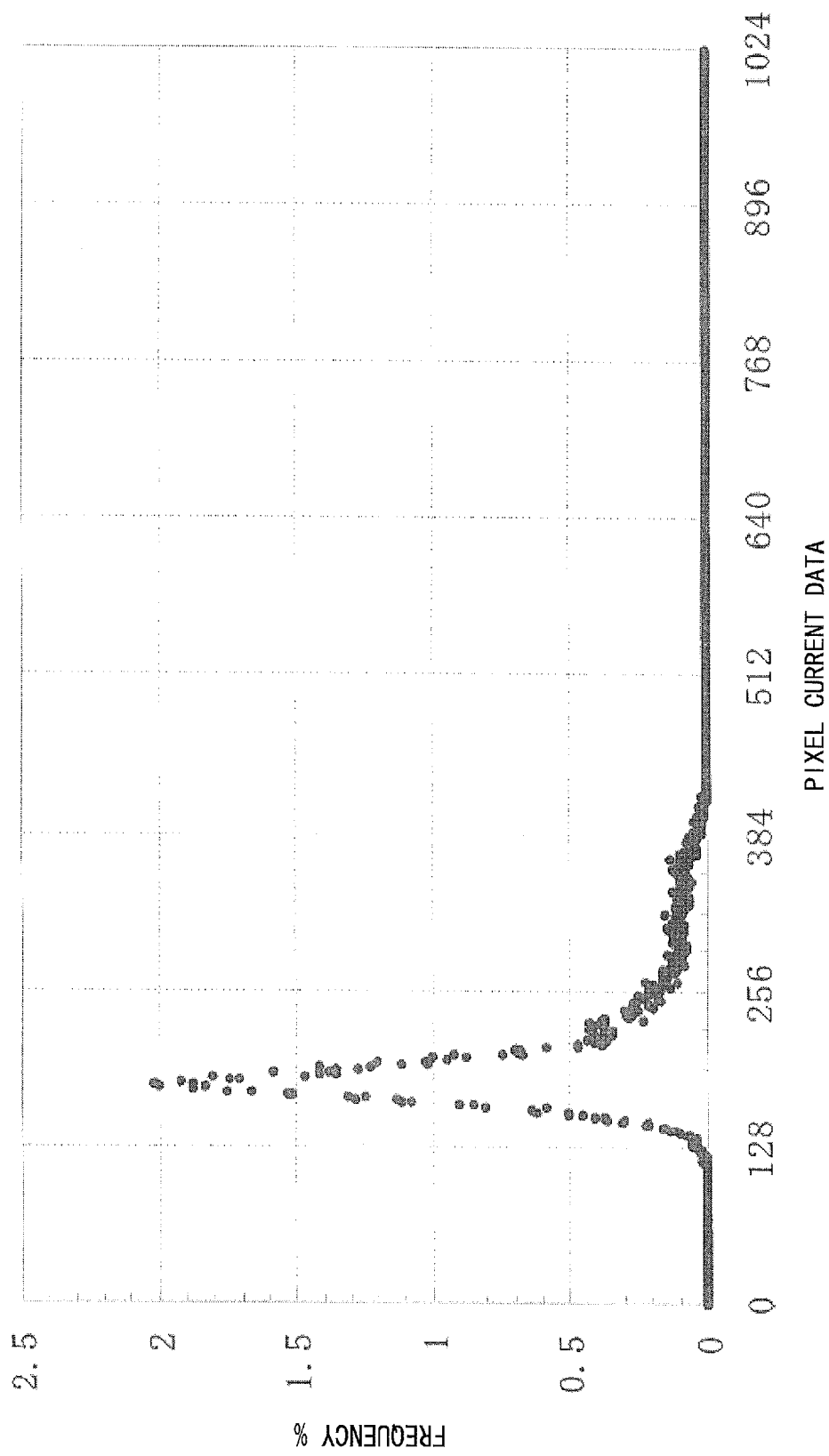
FIG. 14 is a histogram for the whole of the low frequency components.
Figure 15:
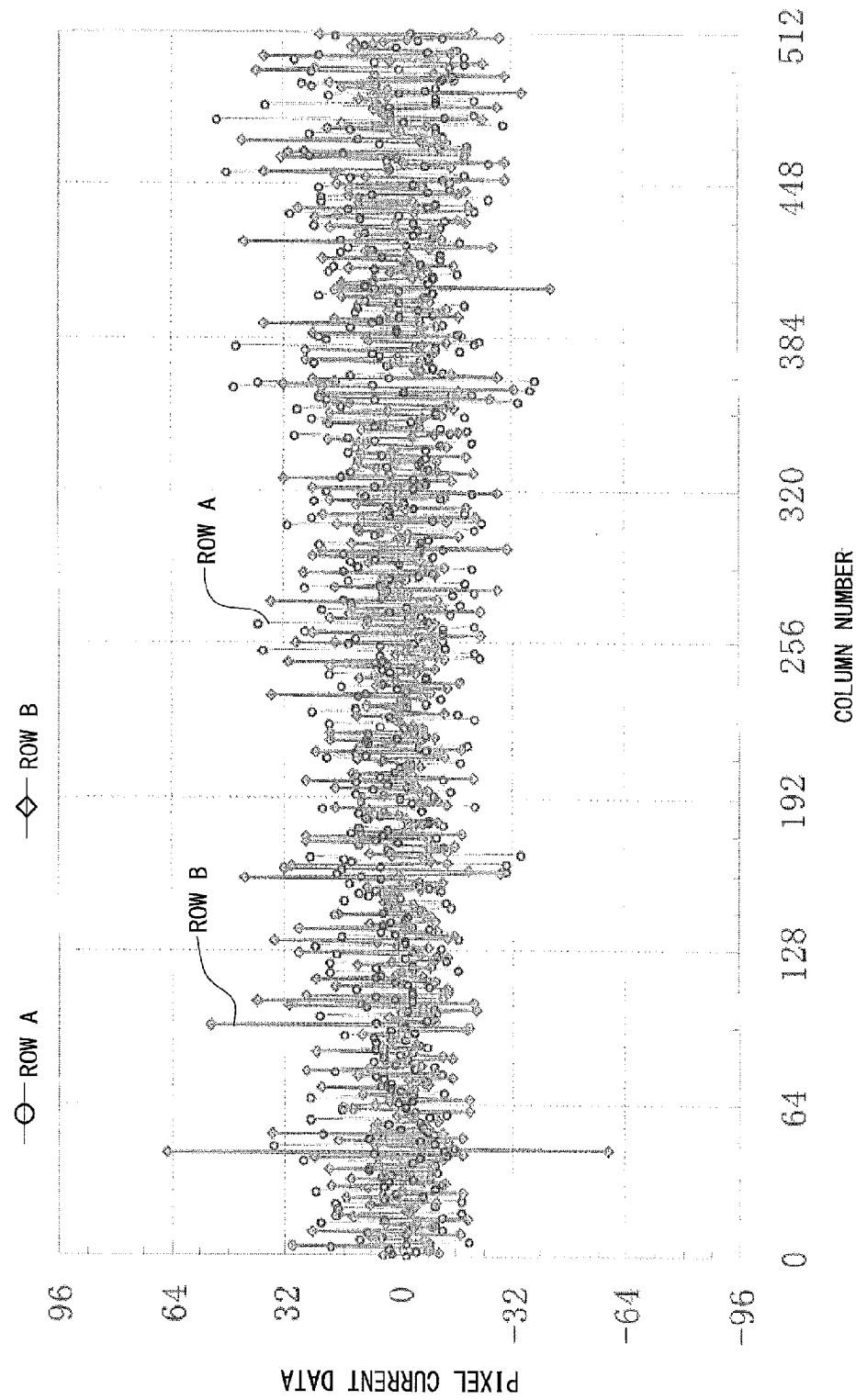
FIG. 15 is a diagram showing high frequency components of the pixel current data of the first to 512th columns.
Figure 16:
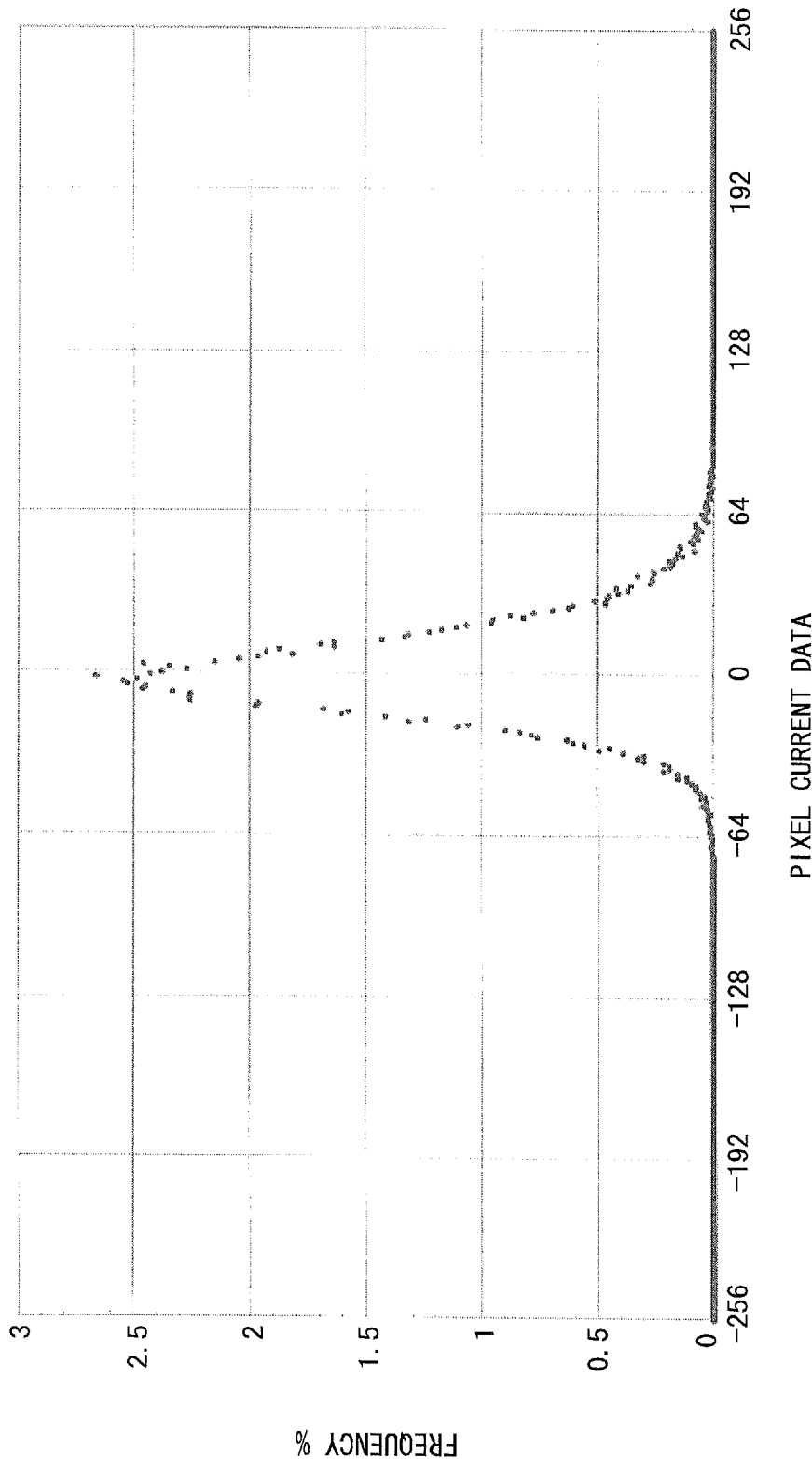
FIG. 16 is a histogram for the whole of the high frequency components.

Here, a description will be given of a view about reduction in data amount in the present invention. First, FIG. 11 shows an example of the pixel current data I. FIG. 11 shows the pixel current data I of the first to 512th columns with respect to certain two rows (row A, row B). It should be noted that FIG. 12 shows a histogram for the whole of the pixel current data I. The pixel current data I can be divided into a low frequency component and a high frequency component. FIG. 13 shows the low frequency components of the pixel current data I of the first to 512th columns, and FIG. 14 shows a histogram for the whole of the low frequency components. Further, FIG. 15 shows high frequency components of the pixel current data I of the first to 512th columns, and FIG. 16 shows a histogram for the whole of the high frequency components.

Figure 17:
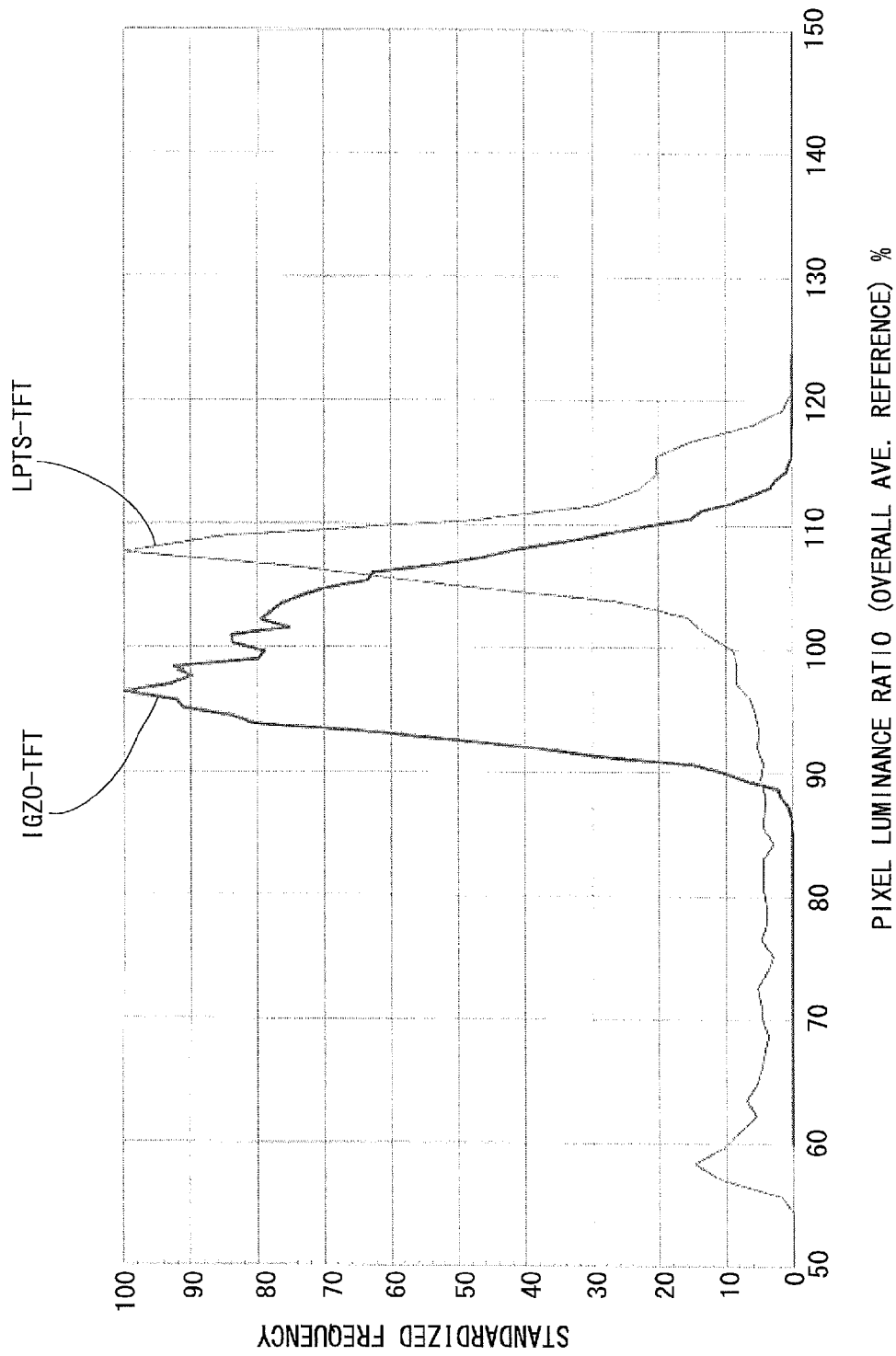
FIG. 17 is a diagram showing variations in luminance in a display device employing an IGZO-TFT and variations in luminance in a display device employing an LIPS-TFT.

As described above, in the present embodiment, an IGZO-TFT as an oxide TFT is employed in each of the transistors T1 to T3 in the pixel circuit 51. Here, when the IGZO-TFT and an LTPS (Low Temperature Poly silicon)-TFT are compared, variations in characteristic in a local region are smaller in the IGZO-TFT than the LTPS-TFT. This will be described with reference to FIG. 17. FIG. 17 is a diagram showing variations in luminance in a display device employing the IGZO-TFT and variations in luminance in a display device employing the LTPS-TFT. A horizontal axis indicates a pixel luminance ratio with an overall average luminance taken as a reference, and a vertical axis shows a standardized frequency. As grasped from FIG. 17, in the display device employing the LTPS-TFT, data of the pixel luminance ratio is distributed in a range from about 55% to about 120%. In contrast, in the display device employing the IGZO-TFT, data of the pixel luminance ratio is included in a range from about 85% to about 115%. As thus described, the variations in characteristic are smaller in the IGZO-TFT than in the LTPS-TFT. This is because a laser process is used in the LTPS-TFT whereas the laser process is not used in the IGZO-TFT. Further, as grasped from FIG. 17, in the IGZO-TFT, a distribution of the variations in characteristic is close to a normal distribution.

With regard to the visibility, it is known that the larger the amplitude of the variations in characteristic, the more visually recognizable the variations in luminance at the time of image display. Considering visual characteristics, the processing efficiency is enhanced by not performing correction in a region where variations in luminance, namely variations in drive current flowing in the pixel circuit 51, are relatively small, but by performing correction on pixels in a region where the variations in luminance on a level not lower than a certain level are visually recognized.

Therefore, concerning the foregoing pixel current data I, since correction is not required when the amplitude of the high frequency component is small, it is possible to delete the high frequency component data IH having an amplitude value within a predetermined range. Here, the variations in characteristic are small and close to the normal distribution as described above concerning the IGZO-TFT, and hence deleting the high frequency component data IH having an amplitude value within the predetermined range allows significant reduction in amount of data to be saved into the storage portion 480.

<1.5.3 Compression Processing>

The compression processing in the present embodiment will be described in detail. In the compression processing, first, the low pass filter 421 is applied to the pixel current data I saved in the first memory described above. Accordingly, the low frequency component out of the pixel current data I is extracted as the low frequency component data IL. Next, the first computing portion 422 obtains a difference between the pixel current data I and the low frequency component data IL. Hence, the high frequency component out of the pixel current data I is extracted as the high frequency component data IH.

Next, data is extracted by the down-sampling portion 426 from the low frequency component data IL at appropriate sampling intervals. It should be noted that the sampling interval is set such that the low frequency component data IL before compression can be completely decoded. For example, the sampling interval is set to "4". In this case, data is extracted with respect to each four pixels. Therefore, in the present embodiment, a data amount MB of the compressed low frequency component data ILc for one row is as follows:

$$MB = MA/4$$
$$= 19{,}200 \text{ bits}/4$$
$$= 4{,}800 \text{ bits (4.6875 kilobits)}$$

It should be noted that since a sequence of measuring a drive current and positions of pixels of data to be sampled are set, positional information is not required to be added to data as a saving object.

Next, the compression processing is performed on the high frequency component data IH by the high frequency signal compression processing portion 427. At that time, first, an amplitude of each high frequency component data IH is inspected. With one pixel current data I having 10 bits, amplitude values that the high frequency component data IH can take are values of "−1023" to "1023". However, as described above, the variations in characteristic in a local region are small in the IGZO-TFT as compared to those in the LTPS-TFT. It is thus grasped that the amplitude of the high frequency component data IH is significantly small in the case of the IGZO-TFT being employed as compared to the case of the LTPS-TFT being employed. For example, in the example shown in FIG. 15, the amplitude values of the high frequency component data IH are values of "−58" to "65".

Data with a relatively small amplitude (low amplitude data) out of the high frequency component data IH has a small influence on display. Hence, it is possible to delete the low amplitude data out of the high frequency component data IH. For example, it is assumed that data with amplitude values of "−31" to "31" is deleted out of the high frequency component data IH. In this case, data with amplitude values of "−58" to "−31" out of the high frequency component data IH and data with amplitude values of "31" to "65" out of the high frequency component data IH are data as a saving object. The range of the amplitude value, in which data is deleted as thus described, is what is called a dead zone.

Figure 18:
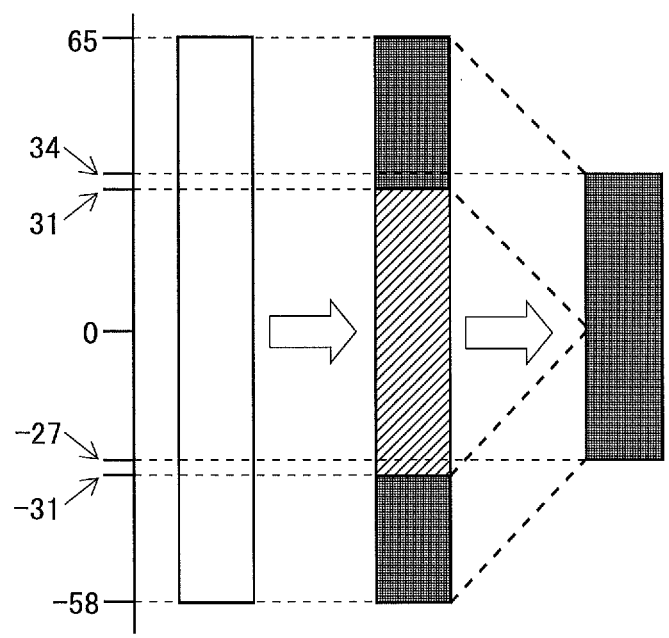
FIG. 18 is a diagram for describing compression of high frequency component data in the first embodiment.

In the present embodiment, accompanied by deletion of data within the dead zone range, high amplitude data out of the high frequency component data IH is redefined with an upper limit or a lower limit of the dead zone taken as a reference. Then, the data as a saving object (high amplitude data) out of the high frequency component data IH is represented by a value of a difference from the upper limit or the lower limit of the dead zone. In the foregoing example, the data with amplitude values of "−58" to "−31" out of the high frequency component data IH is represented by values of "−27" to "0" (see FIG. 18). Further, the data with amplitude values of "31" to "65" out of the high frequency component data IH is represented by values of "0" to "34" (see FIG. 18). As explained above, since only values within the range from "−27" to "34" have to be saved, the data as a saving object can be represented by 7 bits.

Regarding data as a saving object out of the high frequency component data IH, positional information is required to be added. Since the 5-type full HD panel has 1920 columns, 11-bit data is required as positional information to be added. Here, when it is assumed that the number of horizontal pixels is W, the number of bits of horizontal positional information is P, the number of bits of data to be recorded is R, and a ratio of data required to be recorded is K, then a required capacity of the storage portion 480 for recording (saving) data for one row of each color is "W×(P+R)×K". According to an experiment using the data shown in FIG. 11, by deleting the high frequency component data in the manner as described above, it is possible to reduce an amount of data to be saved to as low as 8% of the total. In this case, a data amount MC of the compressed high frequency component data IHc for one row is as follows:

$MC = 1{,}920 \times (11+7) \times 0.08 = 2{,}764.8$ bits (2.7 kilobits)

It should be noted that, hereinafter, the technique of reducing the amount of high frequency component data and recording (saving) it into the storage portion 480 is referred to as a "first high frequency component recording method".

Thus, when the pixel current data I for one row of each color with respect to one standard is focused, a data amount MD of the data to be saved into the storage portion 480 is as follows:

$MD = MB + MC = 7{,}564.8$ bits (7.3875 kilobits)

Since the 5-type full HD panel has 1080 rows, a data amount ME of the whole of the data, which is to be saved, of each color with respect to one standard is as follows:

$ME = MD \times 1{,}080 = 8{,}169{,}984$ bits (about 7.792 megabits)

Further, a data amount MF of data of each color to be saved into the storage portion 480 in the case of not performing the compression processing is as follows:

$MF = 10 \text{ bits} \times 1{,}920 \times 1{,}080 = 20{,}736{,}000$ bits (about 19.775 megabits)

Therefore, a compression ratio of the pixel current data I in the foregoing example is about 39%.

Although the low amplitude data out of the high frequency component data IH is deleted in the above description, the present invention is not restricted to this. The configuration may be such that the low amplitude data out of the high frequency component data IH is relatively roughly quantized, while the high amplitude data out of the high frequency component data IH is relatively finely quantized, and data obtained by the quantization is saved into the storage portion 480.

It should be noted that, in the present embodiment, a current measuring step is realized by processing of the current measuring portion 22 acquiring the pixel current data I, a current data dividing step is realized by processing of the low pass filter 421 and the first computing portion 422 dividing the pixel current data I into the low frequency component data IL and the high frequency component data IH, a high frequency component data compression processing step is realized by processing of the high frequency signal compression processing portion 427 extracting only high amplitude data out of high frequency component data IH, a low frequency component data compression processing step is realized by processing of the down-sampling portion 426 extracting data from the low frequency component data IL at predetermined sampling intervals, and a saving step is realized by processing of the down-sampling portion 426 and the high frequency signal compression processing portion 427 saving the data after compression into the storage portion 480.

<1.5.4 Supplemental Description about Pixel Current Data Compressing-and-Decoding Portion>

Figure 19:
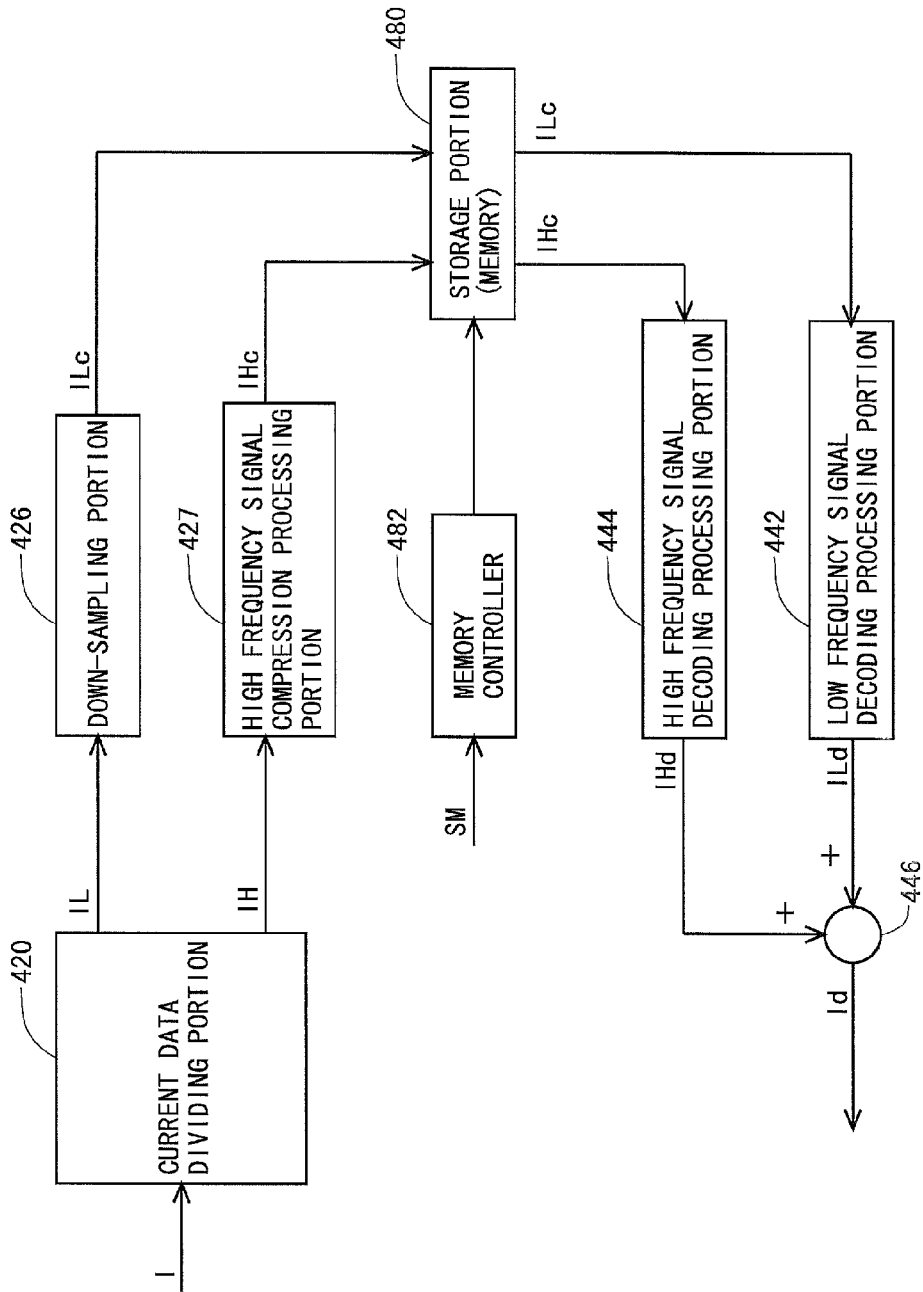
FIG. 19 is a block diagram showing a modification of a configuration of a pixel current data compressing-and-decoding portion.
Figure 20:
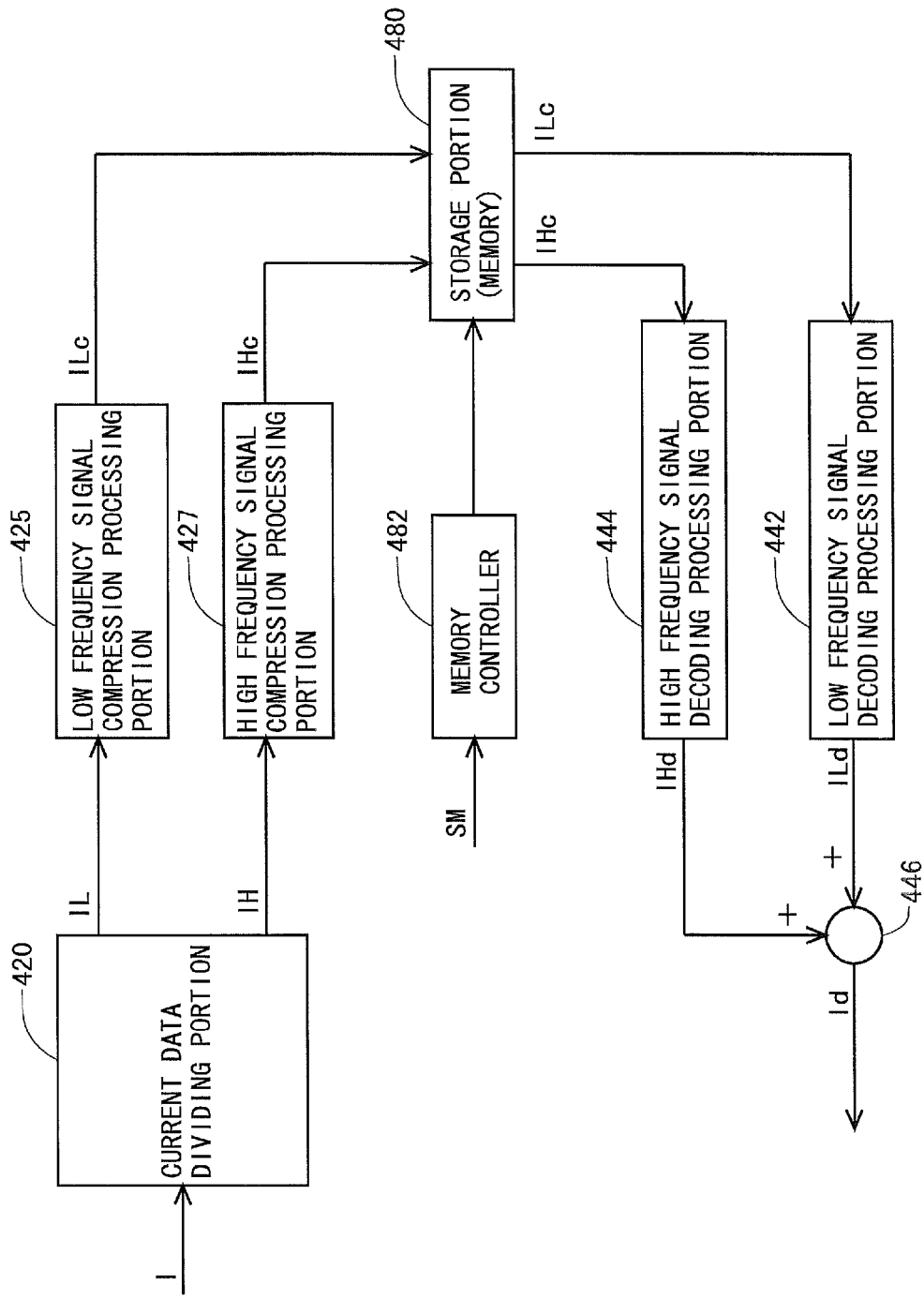
FIG. 20 is a block diagram showing a modification of the configuration of the pixel current data compressing-and-decoding portion.

Although the pixel current data I is divided into the high frequency component data IH and the low frequency component data IL by use of the low pass filter 421 in the foregoing description, the present invention is not restricted to this. The pixel current data I may be divided into the high frequency component data IH and the low frequency component data IL by a different technique from the technique of using a low pass filter, such as a technique of using a high pass filter, for example. That is, the technique of dividing the pixel current data I into the high frequency component data IH and the low frequency component data IL is not particularly restricted so long as there is provided a constitutional element that functions as a current data dividing portion 420 for dividing the pixel current data I into the high frequency component data IH and the low frequency component data IL. Accordingly, the pixel current data compressing-and-decoding portion can be configured as shown in FIG. 19. Further, the low frequency component data IL may be compressed by a different technique from sampling at predetermined intervals. That is, the technique of compressing the low frequency component data IL is not particularly restricted so long as there is provided a constitutional element that functions as a low frequency signal compression processing portion 425 for compressing the low frequency component data IL. Accordingly, the pixel current data compressing-and-decoding portion can be configured as shown in FIG. 20.

<1.6 Gradation Value Correcting Method>

Next, correction of a gradation value in the gradation value correcting portion 46 will be described with reference to FIGS. 21 and 22. Here, "correction of a gradation value" means correcting a gradation value of the gradation signal Va transmitted from the timing controller 10 to the gradation value correcting portion 46 in the gradation signal correction circuit 40 to obtain a gradation value of the driving gradation signal VD to be given to the source driver 20. In addition, data that is transmitted as the gradation signal Va to the gradation value correcting portion 46 is referred to as "input gradation voltage data", and data that is transmitted as the driving gradation signal VD from the gradation value correcting portion 46 is referred to as "output gradation voltage data". Both of the input gradation voltage data and the output gradation voltage data are data associated with a gradation value. Further, the input gradation voltage data and the output gradation voltage data are collectively simply referred to as "gradation voltage data".

In the gradation value correcting portion 46, a gradation value is corrected based on pixel current data after decoding in the data decoding portion 44. More specifically, a gradation value is corrected based on two pixel current data after decoding which are respectively associated with two measuring gradation values on the two standards (first standard and second standard) described above. It should be noted that pixel current data associated with the measuring gradation value on the first standard is referred to as "first standard pixel current data", and pixel current data associated with the measuring gradation value on the second standard is referred to as "second standard pixel current data".

Figure 21:
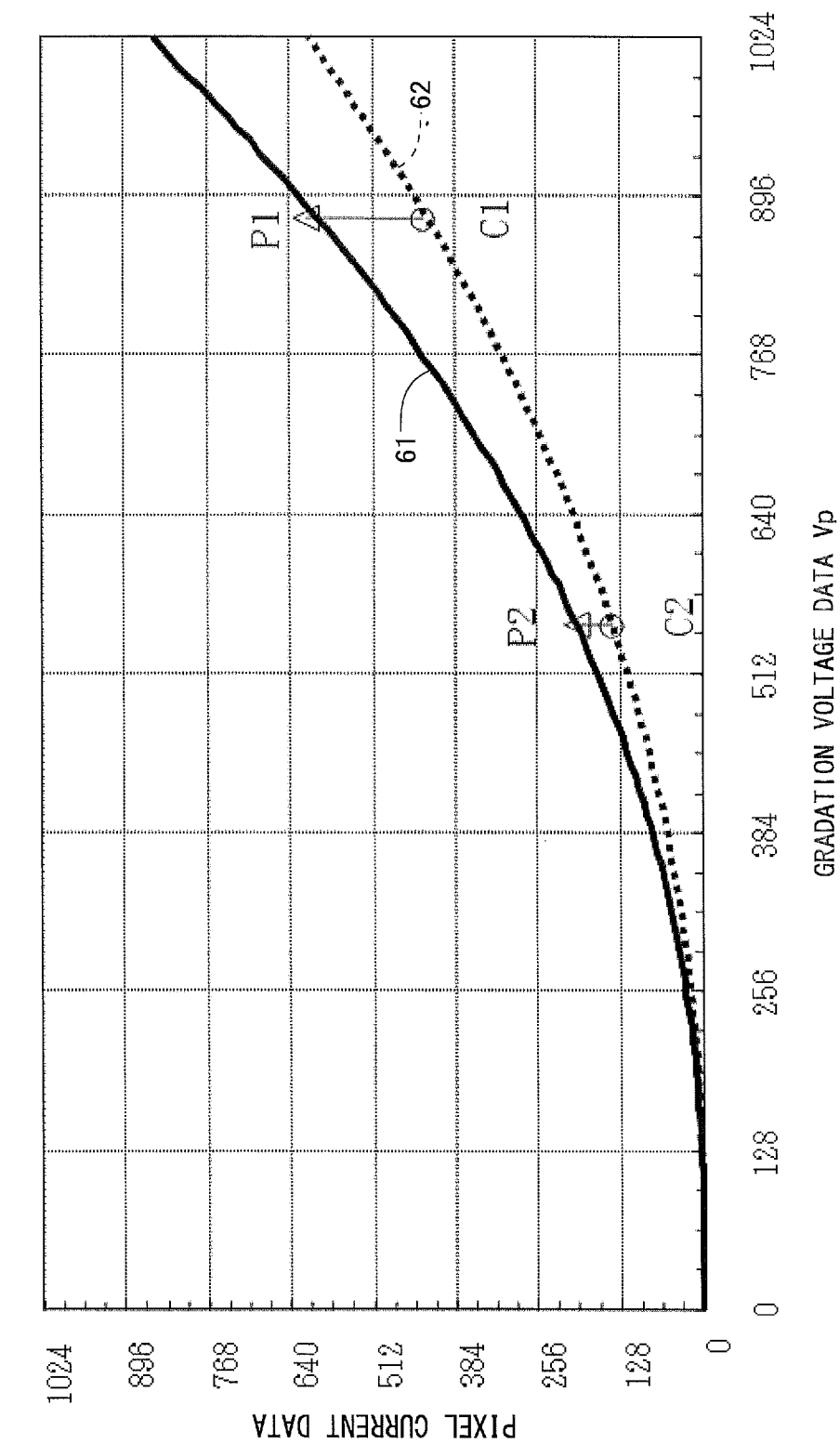
FIG. 21 is a diagram for describing a method for correcting a gradation value in the first embodiment.

FIG. 21 is a diagram showing the relation between gradation voltage data and pixel current data at a certain pixel where a pixel current is measured (hereinafter referred to as "focused pixel"). In general, setup is performed such that the relation between a gradation voltage and a display luminance is represented by an exponential function with a gamma value of 2.2. Further, an almost proportional relation is established between a light emission luminance and a pixel current at each pixel. Hence, the relation between a pixel current (drive current) measured by the current measuring portion 22 (see FIG. 2) and a gradation voltage is also represented by an exponential function with a gamma value of 2.2 as shown in the following formula (4). It should be noted that a characteristic represented by the following formula (4) is generally called a "current voltage characteristic" and the like.

[Mathematical Formula 1]

$$I_P = J \cdot (V_P - K)^{2.2} \quad (4)$$

where $V_P$ represents a gradation voltage corresponding to any gradation value P, $I_P$ represents a pixel current corresponding to the gradation value P, and J and K each represent a constant. Note that, P is any gradation value.

In the above formula (4), a value of J and a value of K vary at each pixel. This is because the current voltage characteristic of the drive transistor varies at each pixel, and an influence by a temporal change in characteristic of the drive transistor varies at each pixel. However, since the relation between the gradation voltage and the pixel current is represented by the exponential function with a gamma value of 2.2 at any pixel, when there exist pixel current data corresponding to measuring gradation values (measuring data voltages) on at least two standards, a current value corresponding to any gradation value can be approximately represented. That is, it is possible to estimate a value of a pixel current corresponding to any gradation value based on pixel current data corresponding to measuring gradation values on two standards (hereinafter simply referred to as "two-standard pixel current data"). A current voltage characteristic as a target (an ideal current voltage characteristic after correction of a gradation value) regarding a focused pixel can also be obtained based on two pixel current data in a similar manner.

By the way, when one of target values of the two-standard pixel current data described above is represented by a symbol $I_C$, for example, an average value of pixel current data (pixel current data $I_P$ obtained by measurement) at all pixels included in one row or all pixels in the display portion 50 can be taken as the pixel current data $I_C$ (pixel current data as a target) (see following formula (5)).

[Mathematical Formula 2]

$$I_C = \overline{I_P} \quad (5)$$

It should be noted that a value calculated based on some reference from a group of pixel current data may be taken as the pixel current data $I_C$, or a previously set value (fixed value) may be taken as the pixel current data $I_C$ regardless of pixel current data to be measured.

In FIG. 21, P1 indicates a value of first standard pixel current data at the time point of measurement at a focused pixel, P2 indicates a value of second standard pixel current data at the time point of measurement at the focused pixel, C1 indicates a value of first standard pixel current data as a target at the focused pixel, and C2 indicates a value of second standard pixel current data as a target at the focused pixel. Further, in FIG. 21, a solid line denoted by numeral 61 represents a current voltage characteristic at the time point of measurement at the focused pixel, and a dotted line denoted by numeral 62 represents a current voltage characteristic as a target at the focused pixel. As described above, the relation between the gradation voltage and the pixel current is represented by the exponential function with a gamma value of 2.2. However, obtaining output gradation voltage data (gradation voltage data after correction) by use of the exponential function complicates the processing. Therefore, in the present embodiment, the pixel current data $I_P$ obtained by measurement is subjected to conversion using the following formula (6), and the pixel current data $I_C$ as a target is subjected to conversion using the following formula (7), thereby representing a current voltage characteristic at the time point of measurement and a current voltage characteristic as a target.

[Mathematical Formula 3]

$$I_A = I_P^{\frac{1}{2.2}} \quad (6)$$

[Mathematical Formula 4]

$$I_B = I_C^{\frac{1}{2.2}} \quad (7)$$

Figure 22:
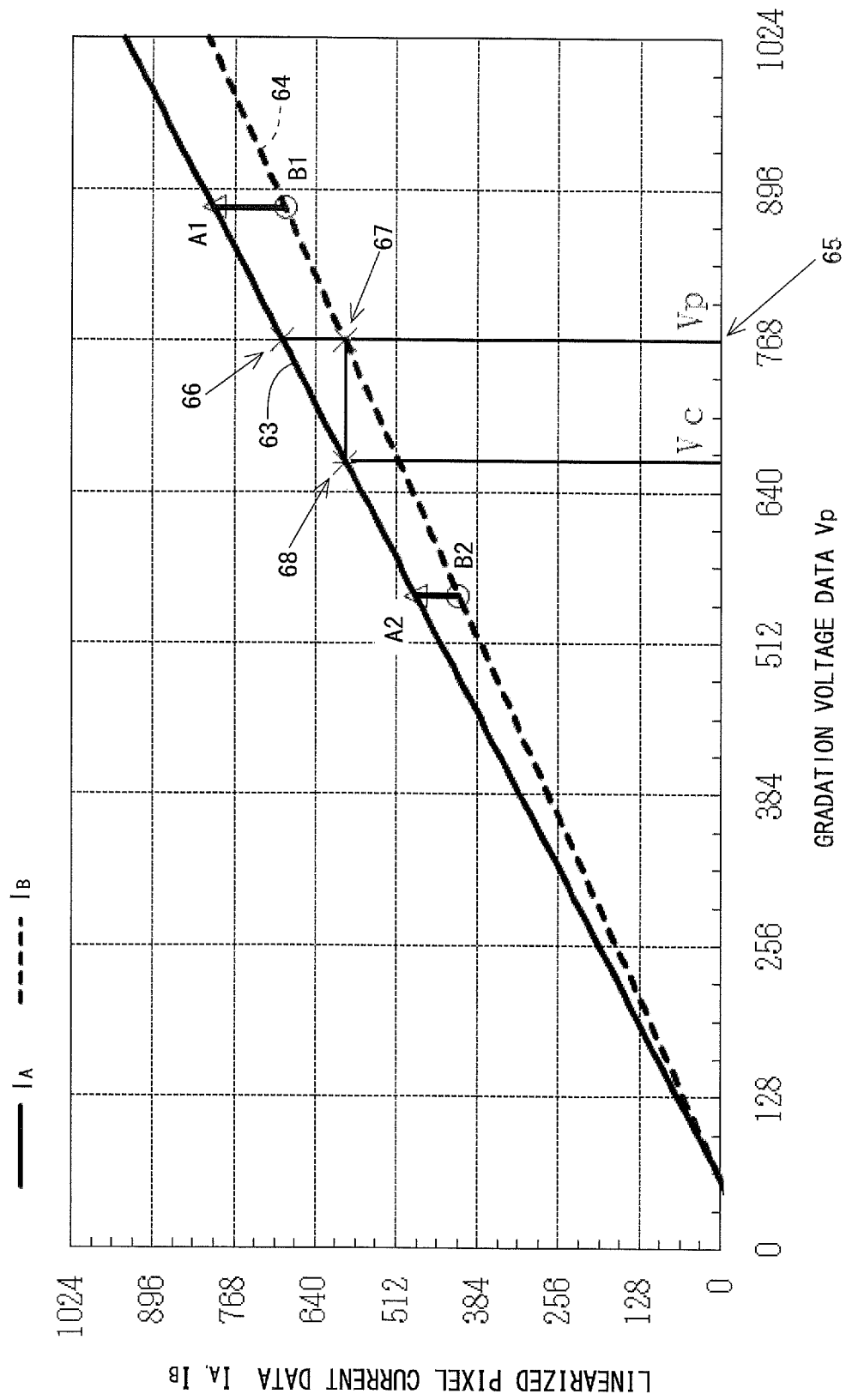
FIG. 22 is a diagram for describing a method for correcting a gradation value in the first embodiment.

The current voltage characteristic at the time point of measurement is represented by a solid line denoted by numeral 63 in FIG. 22 by the conversion using the formula (6). Further, the current voltage characteristic as a target is represented by a dotted line denoted by numeral 64 in FIG. 22 by the conversion using the formula (7). That is, the current voltage characteristic at the time point of measurement and the current voltage characteristic as a target are represented by linearly appropriated functions. Note that data of A1, A2, B1, and B2 in FIG. 22 respectively correspond to the data of P1, P2, C1, and C2 in FIG. 21. From FIG. 22, a straight line connecting A1 and A2 is expressed by the following formula (8), and a straight line connecting B1 and B2 is expressed by the following formula (9). Hereinafter, pixel current data after conversion is referred to as "linearized pixel current data".

[Mathematical Formula 5]

$$I_A(V_P) = \frac{I_{A1} - I_{A2}}{V_{A1} - V_{A2}}(V_P - V_{A2}) + I_{A2} \quad (8)$$

[Mathematical Formula 6]

$$I_B(V_P) = \frac{I_{B1} - I_{B2}}{V_{B1} - V_{B2}}(V_P - V_{B2}) + I_{B2} \quad (9)$$

It should be noted that, although the conversion as described above is performed on the data after decoding in the present embodiment, the present invention is not restricted to this. The conversion as described above may be performed on the data before compression. In this case, current voltage characteristics as denoted by numerals 63 and 64 in FIG. 22 are obtained without performing the conversion on data after decoding.

The formula (8) and the formula (9) each are a function of $V_P$ (the gradation voltage corresponding to any gradation value P). For example, when $V_P$ is a value indicated by an arrow of numeral 65, a value of the linearized pixel current data at the time point of measurement at the focused pixel is a value at a position indicated by an arrow of numeral 66, and a value of the linearized pixel current data as a target at the focused pixel is a value at a position indicated by an arrow of numeral 67.

With regard to any $V_P$, the relation of "$I_A(V_P) > I_B(V_P)$" is established. Further, in FIG. 22, in order to obtain the value of the linearized pixel current data at the position indicated by an arrow of numeral 67, a value of the gradation voltage data has to be a value at a position indicated by an arrow of numeral 68. Moreover, the formula (8) can be transformed as in the following formula (10):

[Mathematical Formula 7]

$$V_P = \frac{I_A(V_P) - I_{A2}}{I_{A1} - I_{A2}}(V_{A1} - V_{A2}) + V_{A2} \quad (10)$$

Considering the above, by substituting $I_B(V_P)$ for $I_A(V_P)$ in the formula (10), it is possible to obtain a value of gradation voltage data for obtaining a value of the linearized pixel current data as a target. That is, a value $V_C$ of output gradation voltage data corresponding to the gradation value P is obtained by the following formula (11):

[Mathematical Formula 8]

$$V_C = \frac{I_B(V_P) - I_{A2}}{I_{A1} - I_{A2}}(V_{A1} - V_{A2}) + V_{A2} \quad (11)$$

In the present embodiment, in the manner as described above, the output gradation voltage data is obtained based on the two-standard pixel current data after decoding with respect to each pixel. In an actual data converting process, arithmetic processing by a logic circuit representing the formula (9) and the formula (11) is performed. It should be noted that, as for a specific technique of correcting a gradation value, a technique other than the above described can be employed.

Figure 23:
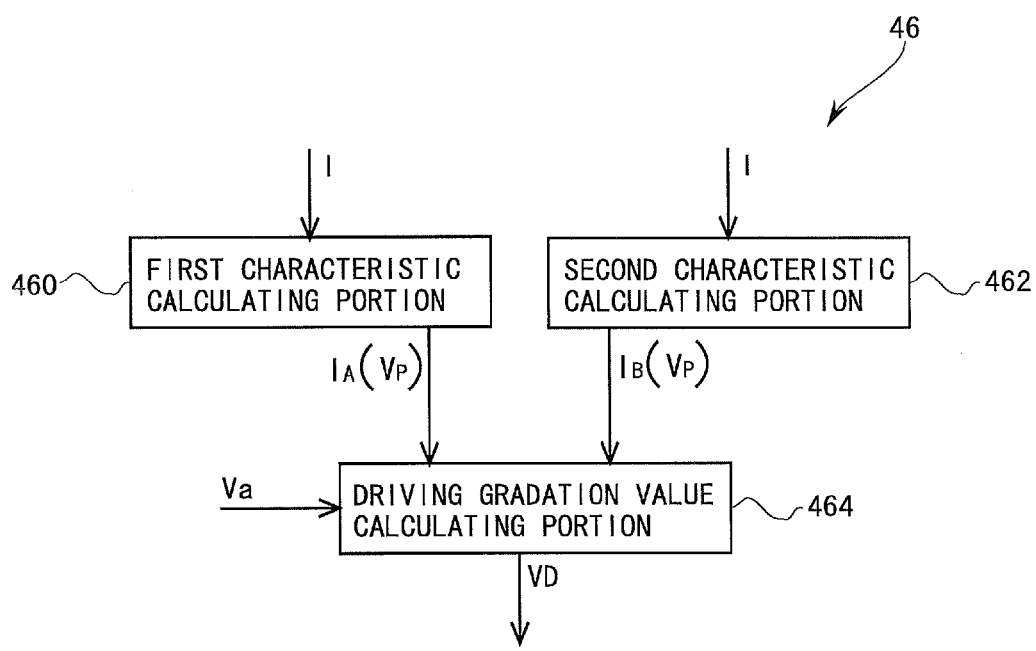
FIG. 23 is a block diagram showing a functional configuration of a gradation value correcting portion in the first embodiment.

In order to realize correction of a gradation value as thus described, the gradation value correcting portion 46 is configured by a function block as shown in FIG. 23. That is, the gradation value correcting portion 46 is constituted by a first characteristic calculating portion 460, a second characteristic calculating portion 462, and a driving gradation value calculating portion 464. The first characteristic calculating portion 460 obtains a current voltage characteristic at the time point of measurement (measured current voltage characteristic) at each pixel based on first standard pixel current data and second standard pixel current data with respect to each pixel. The second characteristic calculating portion 462 takes an average value of pixel current data at all pixels included in one row or all pixels in the display portion 50 as the pixel current data $I_C$ (pixel current data as a target), and obtains a current voltage characteristic as a target (target current voltage characteristic) at each pixel based on the pixel current data $I_C$. That is, the second characteristic calculating portion 462 obtains the target current voltage characteristic at each pixel based on the first standard pixel current data and the second standard pixel current data with respect to a plurality of pixels including that pixel. Here, the first characteristic calculating portion 460 and the second characteristic calculating portion 462 convert the function representing the current voltage characteristic from a non-linear function to a linear function (linearly appropriated function) as described above. The driving gradation value calculating portion 464 obtains output gradation voltage data in the foregoing procedure. That is, the driving gradation value calculating portion 464 obtains a gradation value of the driving gradation signal VD such that a "current value corresponding to a gradation value of the gradation signal Va" obtained from the target current voltage characteristic is equal to a "current value corresponding to a gradation value of the driving gradation signal VD" obtained from the measured current voltage characteristic.

<1.7 Effect>

According to the present embodiment, in the organic EL display device 1 using the IGZO-TFT, the pixel current data I as compensating data, which is acquired for suppressing "occurrence of burning and variations in luminance" caused by "variations in characteristic of the drive transistor or time degradation of the OLED", is processed as follows. First, the pixel current data I is divided into the high frequency component data IH and the low frequency component data IL. Then, as for the low frequency component data IL, the data is extracted by sampling, thereby to reduce an amount of data to be saved into the storage portion 480. Further, as for the high frequency component data IH, low amplitude data is deleted, and high amplitude data is redefined with an upper limit and a lower limit of a dead zone (a range of an amplitude of data as a deleting object) taken as a reference.

In such a manner, also as for the high frequency component data IH, an amount of data to be saved into the storage portion 480 is reduced.

As thus described, at the time of saving the pixel current data I into the storage portion 480, the compression processing with characteristics of the IGZO-TFT taken into consideration is performed. This allows significant reduction in the amount of compensating data to be saved without causing a display failure at the time of image display based on data after decoding. Accordingly, in the organic EL display device 1 using the IGZO-TFT, it is possible to reduce the capacity of the storage portion (memory) for storing compensating data more significantly than conventional display device.

<1.8 Modifications>
<1.8.1 About Compression of High Frequency Component Data>

With regard to recording (saving) of the high frequency component data IH into the storage portion 480, a description will be given to a different technique (referred to as "second high frequency component recording method) from the foregoing first high frequency component recording method. In the second high frequency component recording method, with respect to each pixel, one-bit data indicating whether or not recording is required and data actually required to be recorded are sequentially stored into the storage portion 480. The second high frequency component recording method is employed for example in a case where a ratio of the data required to be recorded out of the high frequency component data IH is not smaller than a certain fixed value. According to this second high frequency component recording method, there is no need for adding positional information with respect to each data required to be recorded.

Here, when it is assumed that the number of horizontal pixels is W, the number of bits of the horizontal positional information is P, the number of bits of data to be recorded is R, and a ratio of data required to be recorded is K, then a required capacity of the storage portion 480 for recording (saving) data of each color is "W+W×R×K". In the case of "K<1/P", the capacity required for recording data is smaller in the first high frequency component recording method than in the second high frequency component recording method. In the case of "K>1/P", the capacity required for recording data is smaller in the second high frequency component recording method than in the first high frequency component recording method. In the foregoing example, because of "P=11", In the case of "K>1/11=9.09(%)", employing the second high frequency component recording method enables further reduction in the amount of data (compression of data).

<1.8.2 About Width of Dead Zone and Sampling Interval>

Figure 24:
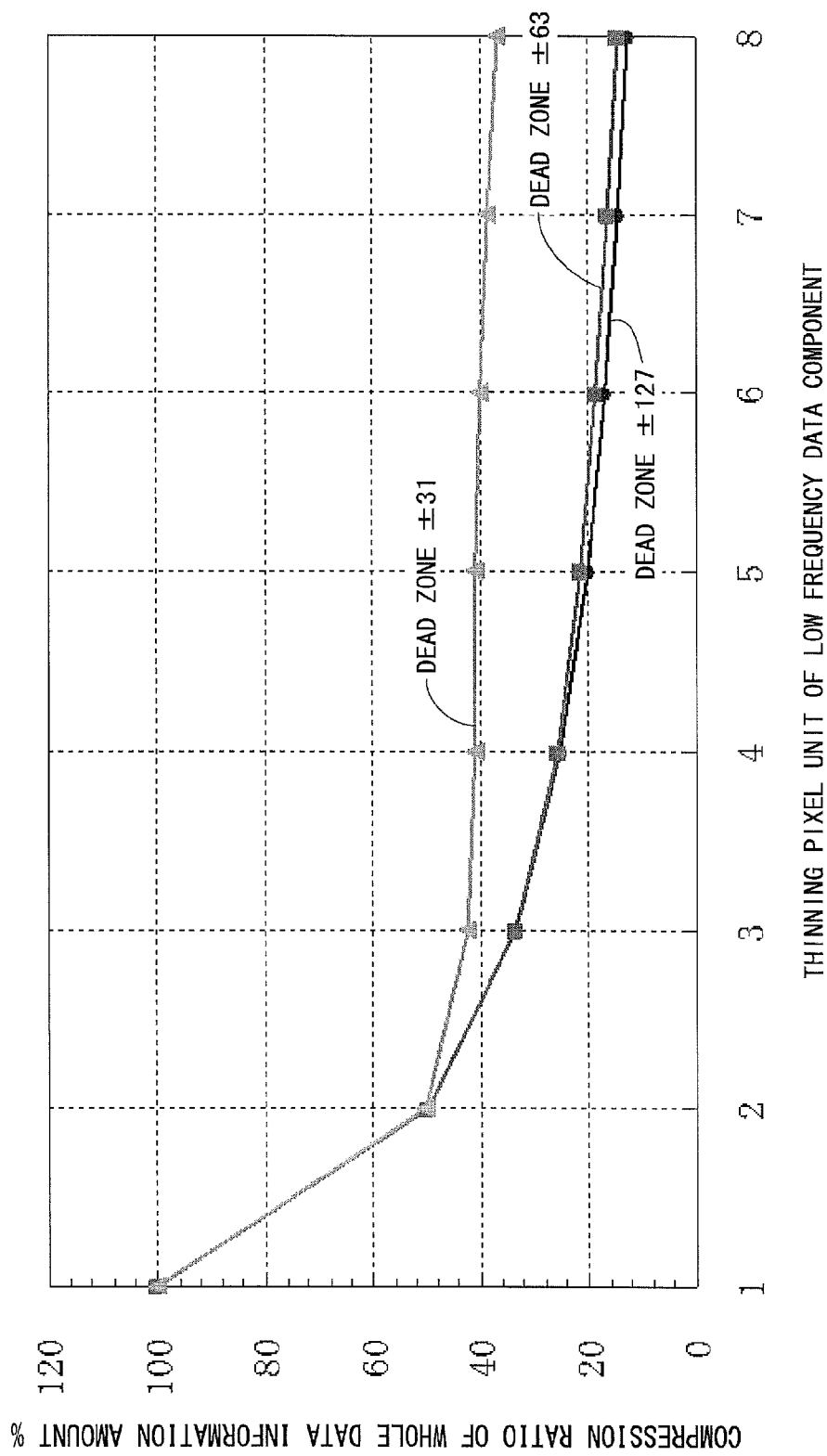
FIG. 24 is a diagram showing a result of comparison made by performing compression processing while changing, to a variety of values, a width of a dead zone at the time of compressing high frequency component data and a sampling interval at the time of compressing low frequency component data.

FIG. 24 is a diagram showing a result of comparison made by performing the compression processing while changing, to a variety of values, the width of the dead zone at the time of compressing the high frequency component data IH and the sampling interval at the time of compressing the low frequency component data IL. It should be noted that a thinning pixel unit in FIG. 24 means the sampling interval in the down-sampling portion 426 (the same applies to FIGS. 25 and 26). In the first embodiment, the range from "−31" to "31" is the dead zone, and the sampling interval in the down-sampling portion 426 is "4". In this case, a whole compression ratio is about 40%. Here, it is grasped from FIG. 24 that the whole compression ratio becomes about 26% by setting a range from "−63" to "63" or a range from "−127" to "127" as the dead zone. Further, when the sampling interval is increased, the low frequency component data IL as a saving object decreases, thus leading to a further increase in compression ratio.

<1.8.3 Comparison Between First High Frequency Component Recording Method and Second High Frequency Component Recording Method>

Figure 25:
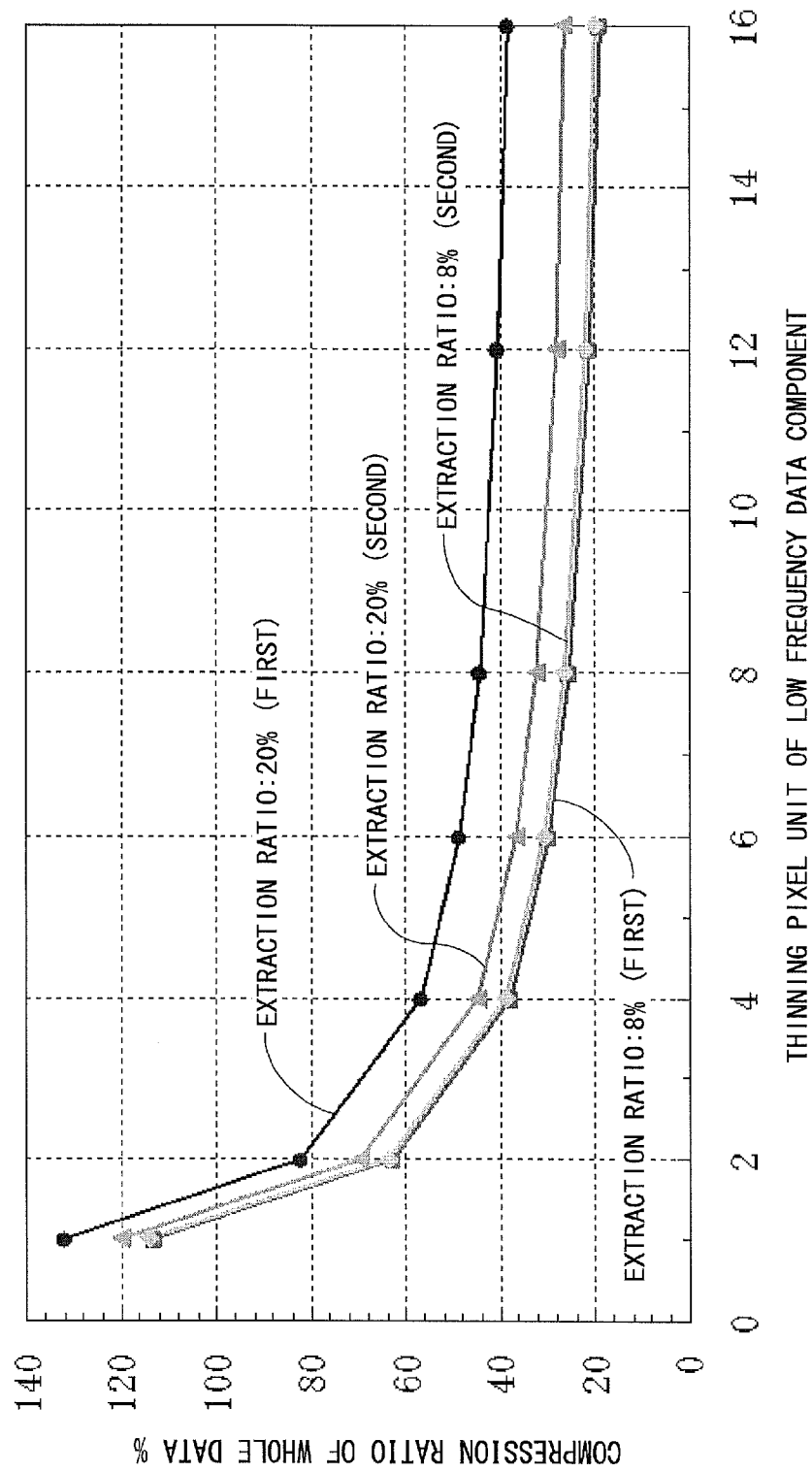
FIG. 25 is a diagram for comparing a first high frequency component recording method and a second high frequency component recording method.
Figure 26:
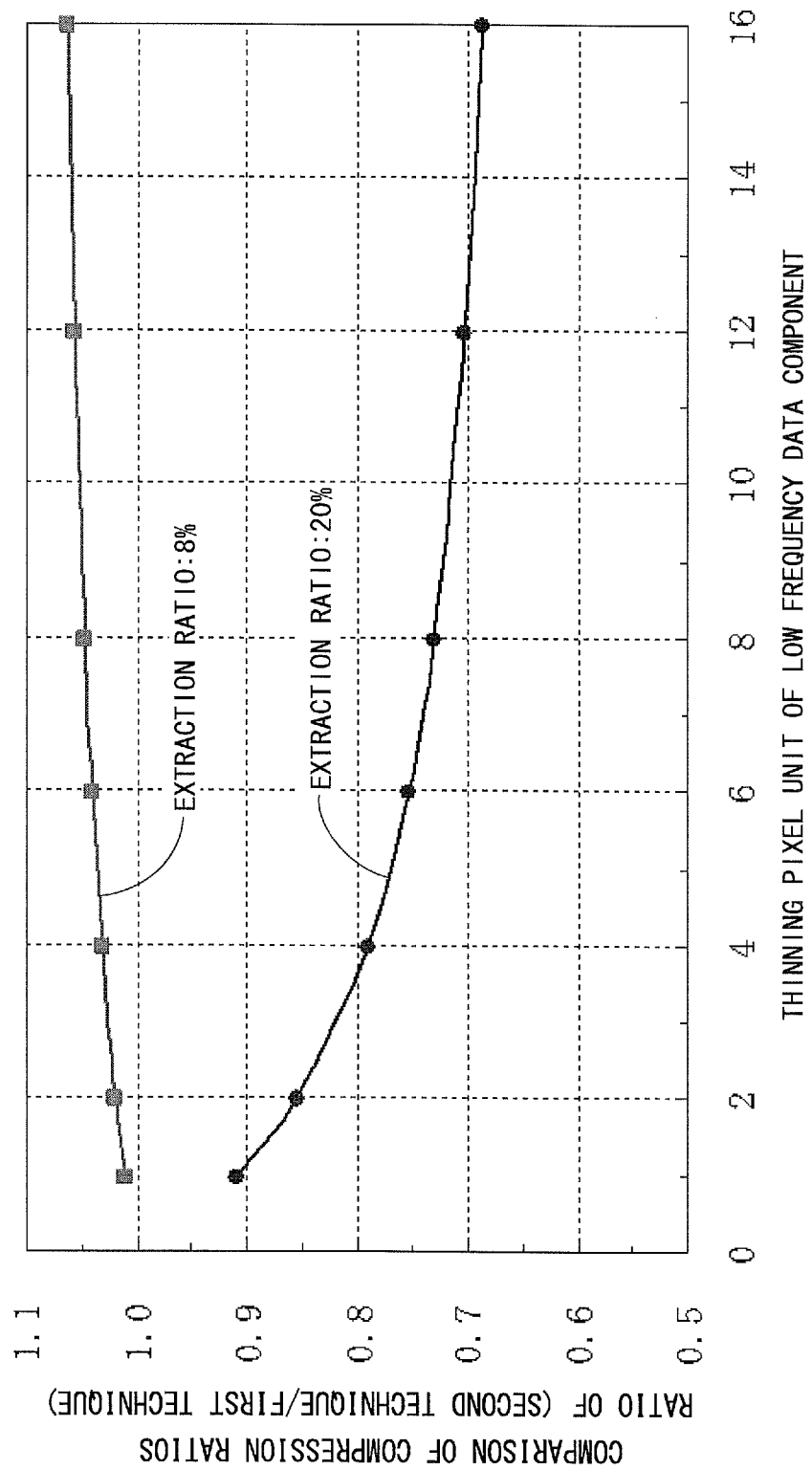
FIG. 26 is a diagram for comparing the first high frequency component recording method and the second high frequency component recording method.

FIG. 25 and FIG. 26 are diagrams for comparing the first high frequency component recording method and the second high frequency component recording method. FIG. 25 shows a whole compression ratio in the case of an extraction ratio of the high frequency component data IH being 20%, and a whole compression ratio in the case of an extraction ratio of the high frequency component data IH being 8%, in each of the first high frequency component recording method and the second high frequency component recording method. Further, FIG. 26 shows a 'ratio between the "compression ratio in the first high frequency component recording method" and the "compression ratio in the second high frequency component recording method"' in each of the cases of the extraction ratios of the high frequency component data IH being 20% and 8%.

It is grasped from FIG. 25 and FIG. 26 that a large difference occurs in the whole compression ratio depending on the extraction ratio of the high frequency component data IH. When the extraction ratio of the high frequency component data IH is 8%, the compression ratio in the first high frequency component recording method is higher than the compression ratio in the second high frequency component recording method. However, when the extraction ratio of the high frequency component data IH is 20%, the compression ratio in the first high frequency component recording method is lower than the compression ratio in the second high frequency component recording method. As thus described, when the extraction ratio of the high frequency component data IH is high, the whole compression ratio can be enhanced by employing the second high frequency component recording method. Further, at that time, the compression ratio can further be enhanced by increasing the sampling interval of the low frequency component data.

As thus described, when variations in luminance on the display panel are particularly large and the memory capacity can be made relatively large, more effective data compression is performed in the second high frequency component recording method than in the first high frequency component recording method. However, either the first high frequency component recording method or the second high frequency component recording method may be selected in accordance with a memory capacity mountable in the display device or the degree of variations in luminance on the display panel.

<2. Second Embodiment>

Hereinafter, only a matter different from the first embodiment will be described, and a description of a similar matter to the first embodiment will be omitted. It should be noted that, in the present embodiment and a third embodiment described later, with regard to a display device having 1920×1080 pixels, the storage portion for high frequency component data after compression out of the prepared storage portion (memory) 480 is assumed to be 2M bits, for the sake of simplifying the description. In addition, each pixel data is assumed to be 6 bits. In this case, a data amount D1 of the pixel current data I before compression is as follows:

$$D1 = 6 \times 1{,}920 \times 1{,}080 = 12{,}441{,}600 \text{ bits (about 11.87 megabits)}$$

Therefore, a compression ratio of about 17% has to be realized. When the compression processing is performed while a compression parameter is controlled one row by one row, an average data amount D2 per row with respect to the pixel current data I after compression is required to be set as follows:

$$D2=2\times1,024\times1,024/1,080 =1,941 \text{ bits}$$

<2.1 Compression Technique>

In the present embodiment, a compression method for the high frequency component data IH is different from that in the first embodiment. Therefore, in the following, a description will be given of the compression method for the high frequency component data IH in the present embodiment (hereinafter referred to as "dead zone technique"). In the dead zone technique, the width of the dead zone is set to a compression parameter P. As described above, the high frequency component data IH having a value within the dead zone range is deleted. For this reason, the larger the range of the compression parameter P is, the higher the compression ratio is and the smaller the amount of data after compression (compressed high frequency component data IHc) is. Here, 17 bits (6 bits of amplitude information and 11 bits of horizontal positional information) per one data are required for saving the high frequency component data IH having values outside the dead zone range into the storage portion 480. Accordingly, an average number D3 of data of the high frequency component data IH as a saving object per row is as follows:

$$D3=(2\times1,024\times1,024/1,080)/17 =114$$

Here, it is assumed that "the compression processing is performed on the first row with the compression parameter P set to "−31" to "31" and the number of high frequency component data IH whose values are outside the dead zone range at that time is "130". At this time, an average number D4 of data of the high frequency component data IH as a saving object per row at the time of the compression processing on the second row and thereafter is as follows:

$$D4=((2\times1,024\times1,024-17\times130)/(1,080-1))/17 =114$$

D4 is "114", whereas the number of high frequency component data IH whose values are outside the dead zone range with respect to the first row is"130". Assuming that a tendency of the data on the second row is almost the same as a tendency of the data on the first row, when the value of the compression parameter P is held, the number of high frequency component data IH whose values are outside the dead zone range (high frequency component data IH which actually become a saving object) is larger than the number of saving object data as a target. Hence, after the compression parameter P is updated (changed) to "−32" to "32", the compression processing is performed on the data on the second row. It should be noted that the compression parameter P is updated (changed) by the memory controller 482 (see FIG. 1).

It is then assumed that the number of high frequency component data IH whose values are outside the dead zone range became "120" at the time of the compression processing on the data on the second row. At this time, an average number D5 of data of the high frequency component data IH as a saving object per row at the time of compression processing on the third row and thereafter is as follows:

$$D5=((2\times1,024\times1,024-17\times(130+120)/(1,080-2))/17 =114$$

Also here, the number of high frequency component data IH whose values are outside the dead zone range (high frequency component data IH which actually become a saving object) is larger than the number of saving object data as a target. Hence, after the compression parameter P is updated to "−33" to "33", the compression processing is performed on the data on the third row.

Further, it is assumed that the number of high frequency component data IH whose values are outside the dead zone range became "100" at the time of the compression processing on the data on the third row. At this time, an average number D6 of data of the high frequency component data IH as a saving object per row at the time of the compression processing on the fourth row and thereafter is as follows:

$$D6=((2\times1,024\times1,024-17\times(130+120+100)/(1,080-3))/17 =114$$

Here, the number of high frequency component data IH whose values are outside the dead zone range (high frequency component data IH which actually become a saving object) is smaller than the number of saving object data as a target. Hence, after the compression parameter P is updated to "−32" to "32", the compression processing is performed on the data on the fourth row.

While the processing as above is repeated, the high frequency component data IH is compressed. That is, in the present embodiment, the high frequency signal compression processing portion 427 performs data compression with respect to each high frequency component data IH corresponding to the pixel circuits 51 for one row. The dead zone range (the upper limit and lower limit of the amplitude) serving as a reference at the time of redefining the high amplitude data out of the high frequency component data IH is obtained when the high frequency component data IH corresponding to the pixel circuits 51 on each row are compressed, in consideration of an amount of data after compression with respect to a row where the data compression has already been performed, the capacity of the storage portion 480, and the like. Accordingly, the amount of the compressed data is deleted such that the pixel current data I after compression is normally saved into the storage portion 480. It should be noted that, although the value of the compression parameter P is updated with an interval of 1 in the present embodiment, the present invention is not restricted to this. For example, the configuration may be such that the value of the compression parameter P is greatly varied when the number of data whose values are outside the dead zone range is greatly different from the number of saving object data as a target. Further, the configuration may be such that the value of the compression parameter P is held as it is when the number of data whose values are outside the dead zone range is almost equal to the number of saving object data as a target, for example.

<2.2 Effect>

Concerning image display in the display device, even when variations in luminance are within a certain level of region in an initial state, it can happen that the variations in luminance gradually increases with a lapse of time. In this respect, according to the present embodiment, the value of the compression parameter P is decided in consideration of the remaining capacity of the storage portion 480, whereby it is possible to make the amount of the compressed data not larger than a predetermined capacity even when variations in luminance on the panel change with time.

<3. Third Embodiment>

<3.1 Compression Technique>

In the present embodiment, a compression method for the high frequency component data IH is different from that in the first embodiment. Therefore, in the following, a description will be given of the compression method for the high frequency component data IH in the present embodiment (hereinafter referred to as "re-quantization technique"). In the re-quantization technique, multiplication of data (high frequency component data IH) and a predetermined coefficient is performed before re-quantization, and a value of the coefficient for the multiplication is set to the compression parameter P. As the value of the compression parameter P decreases, a value of data obtained by the multiplication approaches "0", and a length of Huffman coding is shorter. Accordingly, the compression ratio increases, and the amount of the data after compression (compressed high frequency component data IHc) decreases. Hereinafter, this will be described in detail by using a specific example.

Figure 27:
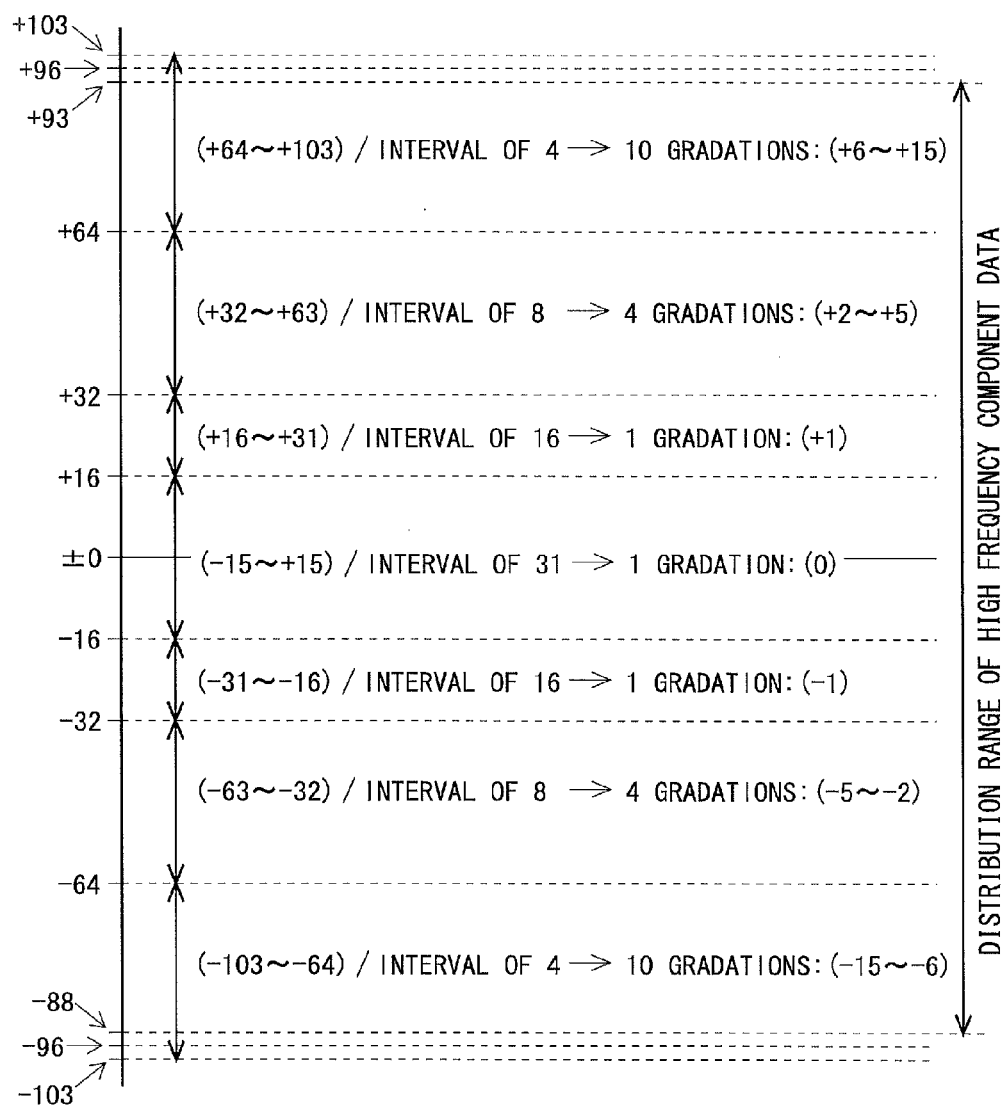
FIG. 27 is a diagram for describing re-quantization of high frequency component data in a third embodiment of the present invention.

FIG. 27 is a diagram for describing re-quantization of the high frequency component data IH. FIG. 27 shows an example of re-quantizing the high frequency component data IH to 5-bit data. In the present embodiment, with regard to the high frequency component data IH extracted from the pixel current data I, data with a small absolute value is roughly quantized, and data with a large absolute value is finely quantized. In the example shown in FIG. 27, for example, data within a range from "−15" to "15" is quantized to "0", data within a range from "16" to "31" is quantized to "1", and data within a range from "−63" to "−32" is quantized to "−5" to "−2". The data within the range from "−63" to "−32" is specifically described below. Data within a range from "−63" to "−56" is quantized to "−5", data within a range from "−55" to "−48" is quantized to "−4", data within a range from "−47" to "−40" is quantized to "−3", and data within a range from "−39" to "−32" is quantized to "−2".

As described above, the high frequency component data IH within the range from "−103" to "103" is represented by 5 bits. It should be noted that the following is a reason why a quantized width ("interval of 31", "interval of 16", etc.) with respect to the width ("−15" to "15", "16" to "31", etc.) of the data range is made larger when the level (value of the high frequency component data IH) is smaller. A distribution of the high frequency component data IH is generally close to a normal function. Therefore, the effect of compensating variations in current is relatively small even when gradation compensation is performed on data within a certain range. For this reason, considering the relation between the compression ratio of data and the effect of compensating the variations, quantization is performed more efficiently by adjusting the quantized width in accordance with the distribution of the high frequency component data IH than by equalizing the roughness of quantization in the whole range. From the above, the value of the compression parameter P (the value of the coefficient) is preferably set with respect to each data range. In addition, for simplifying a description, it is assumed in the following, that the compression parameter P (coefficient) is set to the same value with respect to all the data ranges FIG. 28 is a diagram showing one example of a Huffman coding table. In the present embodiment, concerning a result of re-quantizing the high frequency component data IH as shown in FIG. 15, for example, to 5-bit data (specifically, data on 31 levels of "−15" to "15") (see FIG. 27), data replacement in accordance with the Huffman coding table is sequentially performed. For example, according to FIG. 27, data having a value of "−60" is re-quantized to "−5". Then, according to FIG. 28, "−5" is coded to "110111". Further, for example, according to FIG. 27, data having a value of "10" is re-quantized to "0". Then, according to FIG. 28, "0" is coded to "0".

Here, it is assumed that 'compression processing including re-quantization with respect to the first row is performed with the compression parameter P set to "$10/16$", and as a result, the bit number of Huffman-coded data for one row is "1700". At this time, an average bit number $D7$ of the high frequency component data IH as a saving object per row at the time of the compression processing on the second row and thereafter is as follows:

$$D7=(2\times1,024\times1,024-1,700)/(1,080-1)=1,942$$

D7 is "1942", whereas the bit number of the Huffman-coded data with respect to first row is "1700". Assuming that a tendency of the data on the second row is almost the same as a tendency of the data on the first row, when the value of the compression parameter P is held, the actual bit number of the saving object data is smaller than the bit number of the saving object data as a target. Hence, after the compression parameter P is updated to "$11/16$", the compression processing is performed on the data on the second row.

It is then assumed that the bit number of the Huffman-coded data for one row is "1950" at the time of the compression processing on the data on the second row. At this time, an average bit number $D8$ of the high frequency component data IH as a saving object per row at the time of the compression processing on the third row and thereafter is as follows:

$$D8=(2\times1,024\times1,024-(1,700+1,950))/(1,080-2)=1,942$$

Here, the actual bit number of the saving object data is a value relatively close to the bit number of the saving object data as a target. Hence, the compression processing is performed on the data on the third row without updating the compression parameter P.

Further, it is assumed that the bit number of the Huffman-coded data for one row is "2000" at the time of the compression processing on the data on the third row. At this time, an average bit number $D9$ of the high frequency component data IH as a saving object per row at the time of the compression processing on the fourth row and thereafter is as follows:

$$D9=(2\times1,024\times1,024-(1,700+1,950+2,000))/(1,080-3)=1,941$$

Here, the actual bit number of the saving object data is larger than the bit number of the saving object data as a target. Hence, after the compression parameter P is updated to "10/16", the compression processing is performed on the data on the fourth row.

While the processing as above is repeated, the high frequency component data IH is compressed. That is, in the present embodiment, the high frequency signal compression processing portion 427 performs the compression processing including re-quantization and Huffman coding with respect to each high frequency component data IH corresponding to the pixel circuits 51 for one row. Before the re-quantization is performed, processing of multiplying a value of the high frequency component data IH as a re-quantization object by a coefficient (parameter value) is performed. The coefficient is obtained when the high frequency component data IH corresponding to the pixel circuits 51 on each row are re-quantized, in consideration of an amount of data after Huffman-coding with respect to a row where the re-quantization and the Huffman coding have already been performed, the capacity of the storage portion 480, and the like. Accordingly, the amount of the compressed data is deleted such that the pixel current data I after compression is normally saved into the storage portion 480. It should be noted that, although the example where re-quantization is performed on the high frequency component data IH has been described here, re-quantization may be performed on the low frequency component data IL.

<3.2 Effect>

Concerning image display in the display device, even when variations in luminance are within a certain level of region in an initial state, it can happen that the variations in luminance gradually increases with a lapse of time. In this respect, according to the present embodiment, the value of the compression parameter P at the time of the compression processing including re-quantization is decided in consideration of the remaining capacity of the storage portion 480. Thus, it is possible to make the amount of the compressed data not larger than a predetermined capacity even when variations in luminance on the panel change with time.

<4. Fourth Embodiment>

<4.1 Adjustment of Sampling Interval>

In the present embodiment, it is assumed that the capacity of the storage portion 480 for holding compensating data is limited and the pixel current data I acquired by the current measuring portion 22 has to be compressed with a compression ratio of 25%. In addition, it is presupposed that the low frequency component data IL is compressed by sampling similarly to the first embodiment, and the high frequency component data IH is compressed by re-quantization similarly to the third embodiment.

When the Huffman coding table is used, the following formula (12) is established between an overall data compression ratio K and an average Huffman coding length H of the high frequency component data IH:

[Mathematical Formula 9]

$$K = \frac{\frac{M}{N} + H}{M} \times 100 \quad (12)$$

where M represents a bit number of one pixel current data I, and N represents a sampling interval at the time of compressing the low frequency component data IL.

In the formula (12), the compression ratio K as a target is 25% and the average Huffman coding length H is certainly a value not smaller than 1 (see FIG. 28). Accordingly, for example, in the case of "M=10", N is a value not smaller than 7. That is, in the case of "M=10", at the time of compressing the low frequency component data IL, data sampling has to be performed with respect to each seven or more pixels.

Here, it is assumed that in a series of data compression processes, an average Huffman coding length Ha of the high frequency component data IH for all the rows is "1.35", and a sampling interval N of the low frequency component data IL is "7". In the formula (12), when "M=10", "N=7", and "K=25" are substituted, "H=1.07" is obtained. That is, the average Huffman coding length H, which is required in the case of "N=7", is smaller than the average Huffman coding length Ha of the high frequency component data IH for all the rows. Hence, the compression with the compression ratio of 25% is not performed on the pixel current data I (measurement data) for all the pixels.

Then, a temporary setting of "N=8" is performed, and it is determined whether the average Huffman coding length H, which is required in the case of "N=8", is larger than the Ha. In the formula (12), when "M=10", "N=8", and "K=25" are substituted, "H=1.25" is obtained. Because of "H<Ha", also in this case, the compression with the compression ratio of 25% is not performed on the pixel current data I (measurement data) for all the pixels. Hence, a temporary setting of "N=9" is further performed, and H and Ha are compared in a similar manner as above. In the case of "N=9", "H=1.39" is obtained. Because of "H>Ha", the compression ratio can be made not larger than 25%. Therefore, in the subsequent processing and thereafter, the sampling interval at the time of compressing the low frequency component data IL is set to "9".

In the configuration where the sampling interval N of the low frequency component data IL is changed, it is necessary to change a filter coefficient of the low pass filter 421, which is used for extracting the low frequency component data IL from the pixel current data I, in accordance with a value of N. Concerning this respect, a scope of application of the filter coefficient may be limited depending on a height of a frequency component to be permitted as the low frequency component data IL.

It should be noted that, when the sampling interval N of the low frequency component data IL is increased, a distribution of the low frequency component data IL somewhat changes, and part of data included in the low frequency component data IL before the sampling interval N is increased shifts to the high frequency component data IH. This leads to an increase in number of high frequency component data IH. However, since a distribution of the data level hardly changes, a change in the average Huffman coding length due to the quantization described above is small.

<4.2 Effect>

Concerning image display in the display device, even when variations in luminance are within a certain level of region in an initial state, it can happen that the variations in luminance gradually increases with a lapse of time. In this respect, in the present embodiment, the down-sampling portion 426 calculates the sampling interval N at the time of extracting data as an object to be saved into the storage portion 480 out of a data group constituting the low frequency component data IL so as to obtain a compression ratio as a target which is obtained considering the capacity of the storage portion 480. Hence, it is possible to make the amount of the compressed data not larger than a predetermined capacity even when variations in luminance on the panel change with time.

<5. Others>

The present invention is not restricted to the foregoing embodiments, but can be variously modified and implemented in a range not deviating from the gist of the present invention. For example, the specific method for compressing the high frequency component data IH or the low frequency component data IL is not restricted to the method described in each of the above embodiments.

DESCRIPTION OF REFERENCE CHARACTERS

1: organic EL display device
10: timing controller
20: source driver
21: data voltage supplying portion
22: current measuring portion
30: gate driver
40: gradation signal correction circuit
42: data compressing portion
44: data decoding portion
46: gradation value correcting portion
50: display portion
51: pixel circuit
52: OLED (electric optical element)

420: current data dividing portion
421: low pass filter
422: first computing portion
425: low frequency signal compression processing portion
426: down-sampling portion
427: high frequency signal compression processing portion
443: post filter up-sampling portion
444: high frequency signal decoding processing portion
460: first characteristic calculating portion
462: second characteristic calculating portion
464: driving gradation value calculating portion
480: storage portion
482: memory controller
I: pixel current data
IH: high frequency component data
IL: low frequency component data
IHc: compressed high frequency component data
ILc: compressed low frequency component data
Id: decoded pixel current data
IHd: decoded high frequency component data
ILd: decoded low frequency component data
Va: gradation signal
VD: driving gradation signal

The invention claimed is:

1. A display device including a plurality of pixel circuits each having an electric optical element in which a luminance is controlled by a current, and a drive transistor configured to control a current to be supplied to the electric optical element, the drive transistor having a channel layer formed of an oxide semiconductor, the display device comprising:
a current measuring portion configured to measure a drive current of the drive transistor included in each of the pixel circuits and to output a value of the drive current as current data;
a current data dividing portion configured to divide the current data into high frequency component data and low frequency component data;
a high frequency component data compression processing portion configured to compress the high frequency component data;
a low frequency component data compression processing portion configured to compress the low frequency component data; and
a storage portion configured to save the high frequency component data after compression by the high frequency component data compression processing portion and the low frequency component data after compression by the low frequency component data compression processing portion,
wherein data compression is performed by different techniques in the high frequency component data compression processing portion and the low frequency component data compression processing portion.

2. The display device according to claim 1,
wherein the current data dividing portion has
a high frequency component removing filter configured to allow the low frequency component data out of the current data to pass and remove the high frequency component data out of the current data, and
a low frequency component removing filter configured to allow the high frequency component data out of the current data to pass and remove the low frequency component data out of the current data.

3. The display device according to claim 1,
wherein the current data dividing portion has
a high frequency component removing filter configured to allow the low frequency component data out of the current data to pass and remove the high frequency component data out of the current data, and
a high frequency component computing portion configured to obtain the high frequency component data based on a difference between the low frequency component data having passed through the high frequency component removing filter and the current data.

4. The display device according to claim 1,
wherein the current data dividing portion has
a low frequency component removing filter configured to allow the high frequency component data out of the current data to pass and remove the low frequency component data out of the current data, and
a low frequency component computing portion configured to obtain the low frequency component data based on a difference between the high frequency component data having passed through the low frequency component removing filter and the current data.

5. The display device according to claim 1, wherein the low frequency component data compression processing portion extracts data to be saved into the storage portion from a data group constituting the low frequency component data with respect to each predetermined number of pixel circuits.

6. The display device according to claim 5, wherein the low frequency component data compression processing portion calculates an extraction interval at the time of extracting data to be saved into the storage portion from a data group constituting the low frequency component data so as to obtain a target compression ratio which is determined in consideration of a capacity of the storage portion.

7. The display device according to claim 1, wherein the high frequency component data compression processing portion divides the high frequency component data into low amplitude data having an amplitude not larger than a predetermined width and high amplitude data having an amplitude larger than the predetermined width, and saves only the high amplitude data out of the low amplitude data and the high amplitude data into the storage portion.

8. The display device according to claim 7, wherein the high frequency component data compression processing portion redefines the high amplitude data based on an upper limit and a lower limit of the amplitude with the predetermined width, and saves the redefined high amplitude data into the storage portion.

9. The display device according to claim 8, wherein
the high frequency component data compression processing portion performs data compression with respect to each high frequency component data corresponding to the pixel circuits for one row, and
the upper limit and the lower limit of the amplitude that serve as references at the time of redefining of the high amplitude data are obtained based on data amount after compression with respect to a row where the data compression has already been performed and a capacity of the storage portion when the high frequency component data corresponding to the pixel circuits on each row are compressed.

10. The display device according to claim 1,
wherein the high frequency component data compression processing portion divides the high frequency component data into low amplitude data having an amplitude not larger than a predetermined width and high amplitude data having an amplitude larger than the predetermined width, performs relatively rough quantization on the low amplitude data, performs relatively fine quantization on the high amplitude data, and saves the data obtained by the quantization into the storage portion.

11. The display device according to claim 1, wherein the high frequency component data compression processing portion performs re-quantization on the high frequency component data and performs Huffman coding on the data obtained by the re-quantization, to compress the high frequency component data.

12. The display device according to claim 11, wherein
the high frequency component data compression processing portion performs re-quantization and Huffman coding with respect to each high frequency component data corresponding to pixel circuits for one row, processing of multiplying a value of high frequency component data as an object of re-quantization by a parameter value is performed before the re-quantization is performed, and when the re-quantization is performed on the high frequency component data corresponding to the pixel circuits for each row, the parameter value is obtained based on data amount after Huffman-coding with respect to a row where the re-quantization and the Huffman coding have already been performed and a capacity of the storage portion.

13. The display device according to claim 1, wherein at least one of the high frequency component data compression processing portion and the low frequency component data compression processing portion compresses data by performing the re-quantization.

14. The display device according to claim 1, further comprising a gradation value correcting portion configured to receive a gradation signal that indicates a gradation value corresponding to each of the pixel circuits and to generate a second gradation signal to be used for driving the drive transistor by correcting the first gradation value of the gradation signal,
wherein
the current measuring portion measures drive currents corresponding to at least two gradation values in each of the pixel circuits, and
the gradation value correcting portion has
a first characteristic calculating portion configured to obtain a measured current voltage characteristic which is a current voltage characteristic at the time point of measurement of drive currents in each of the pixel circuits based on current data outputted from the current measuring portion, the current data corresponding to the at least two gradation values in each of the pixel circuits, a second characteristic calculating portion configured to obtain a target current voltage characteristic which is a current voltage characteristic as a target in each of the pixel circuits based on current data corresponding to the at least two gradation values with respect to a plurality of pixel circuits including the pixel circuit, and a driving gradation value calculating portion configured to obtain a first current corresponding to the first gradation signal from the target current voltage characteristic and to obtain the second gradation signal corresponding to the first current from the measured current voltage characteristic.

15. The display device according to claim 14, wherein
the first characteristic calculating portion converts a function representing the measured current voltage characteristic from a non-linear function to a linear function, and
the second characteristic calculating portion converts a function representing the target current voltage characteristic from a non-linear function to a linear function.

16. The display device according to claim 1, wherein the oxide semiconductor is indium gallium zinc oxide mainly composed of indium (In), gallium (Ga), zinc (Zn), and oxygen (O).

17. A data processing method in a display device including a plurality of pixel circuits each having an electric optical element in which a luminance is controlled by a current, and a drive transistor configured to control a current to be supplied to the electric optical element, the drive transistor having a channel layer formed of an oxide semiconductor, the data processing method comprising:
current measuring step of measuring a drive current of the drive transistor included in each of the pixel circuits to output a value of the drive current as current data;
a current data dividing step of dividing the current data into high frequency component data and low frequency component data;
a high frequency component data compression processing step of compressing the high frequency component data;
a low frequency component data compression processing step of compressing the low frequency component data; and
a saving step of saving, into a predetermined storage portion, the high frequency component data after compression by the high frequency component data compression processing step and the low frequency component data after compression by the low frequency component data compression processing step,
wherein data compression is performed by different techniques in the high frequency component data compression processing step and the low frequency component data compression processing step.

* * * * *